(12) United States Patent
Oohata et al.

(10) Patent No.: US 8,476,826 B2
(45) Date of Patent: Jul. 2, 2013

(54) MANUFACTURING METHOD OF DISPLAY DEVICE AND DISPLAY DEVICE

(75) Inventors: Toyoharu Oohata, Tokyo (JP); Katsuhiro Tomoda, Kanagawa (JP); Naoki Hirao, Kanagawa (JP); Masato Doi, Kanagawa (JP)

(73) Assignee: Sony Corporation, Tokyo (JP)

( * ) Notice: Subject to any disclaimer, the term of this patent is extended or adjusted under 35 U.S.C. 154(b) by 489 days.

(21) Appl. No.: 12/731,857

(22) Filed: Mar. 25, 2010

(65) Prior Publication Data

US 2010/0259164 A1 Oct. 14, 2010

(30) Foreign Application Priority Data

Apr. 10, 2009 (JP) ................................. 2009-095897

(51) Int. Cl.
*H01J 1/62* (2006.01)
*H01J 9/20* (2006.01)

(52) U.S. Cl.
USPC .......................................... 313/505; 313/504

(58) Field of Classification Search
USPC ..................... 313/495–512; 315/169.3, 169.4
See application file for complete search history.

(56) References Cited

U.S. PATENT DOCUMENTS 8,159,508 B2 * 4/2012 Lee ............................... 345/690
2002/0067400 A1 * 6/2002 Kawase et al. ................ 347/101

FOREIGN PATENT DOCUMENTS

JP 2006-140398 6/2006

* cited by examiner

*Primary Examiner* — Anh Mai
*Assistant Examiner* — Elmito Breval
(74) *Attorney, Agent, or Firm* — Dentons US LLP

(57) ABSTRACT

A manufacturing method of a display device, includes: a first step of collectively transferring light-emitting elements arranged at every specified number of light-emitting elements formed and arranged on a first substrate to a transfer area set on a second substrate; and a second step of transferring light-emitting elements remaining on the first substrate to between the plural light-emitting elements mounted on the second substrate in at least one of a state where the first substrate is moved with respect to the transfer area on the second substrate and a state where the first substrate is rotated in a plane.

8 Claims, 29 Drawing Sheets

A1-1–A1-4: FIRST TRANSFER AREA
G1: FIRST ELEMENT GROUP (1)

A2-1–A2-6: SECOND TRANSFER AREA
G2: SECOND ELEMENT GROUP (2)

(1)

(2)

(1)

A1-1~A1-4:
FIRST TRANSFER AREA
G1: FIRST ELEMENT GROUP (2)

A2'-1~A2'-9
SECOND TRANSFER AREA
G2: SECOND ELEMENT GROUP (1)

(2)

(1)

(2)

(1)

(2)

A1-1–A1-4:
 FIRST TRANSFER AREA
G1: FIRST ELEMENT GROUP (1)

A1-1–A1-4:
 FIRST TRANSFER AREA
G2(1): SECOND ELEMENT GROUP
 (FIRST GROUP)

(2)

(1)
A2'-1–A2'-9 SECOND TRANSFER AREA
G2(2): SECOND ELEMENT GROUP (SECOND GROUP)

(2)
A2'-1–A2'-9 SECOND TRANSFER AREA
G2(3): SECOND ELEMENT GROUP (THIRD GROUP)

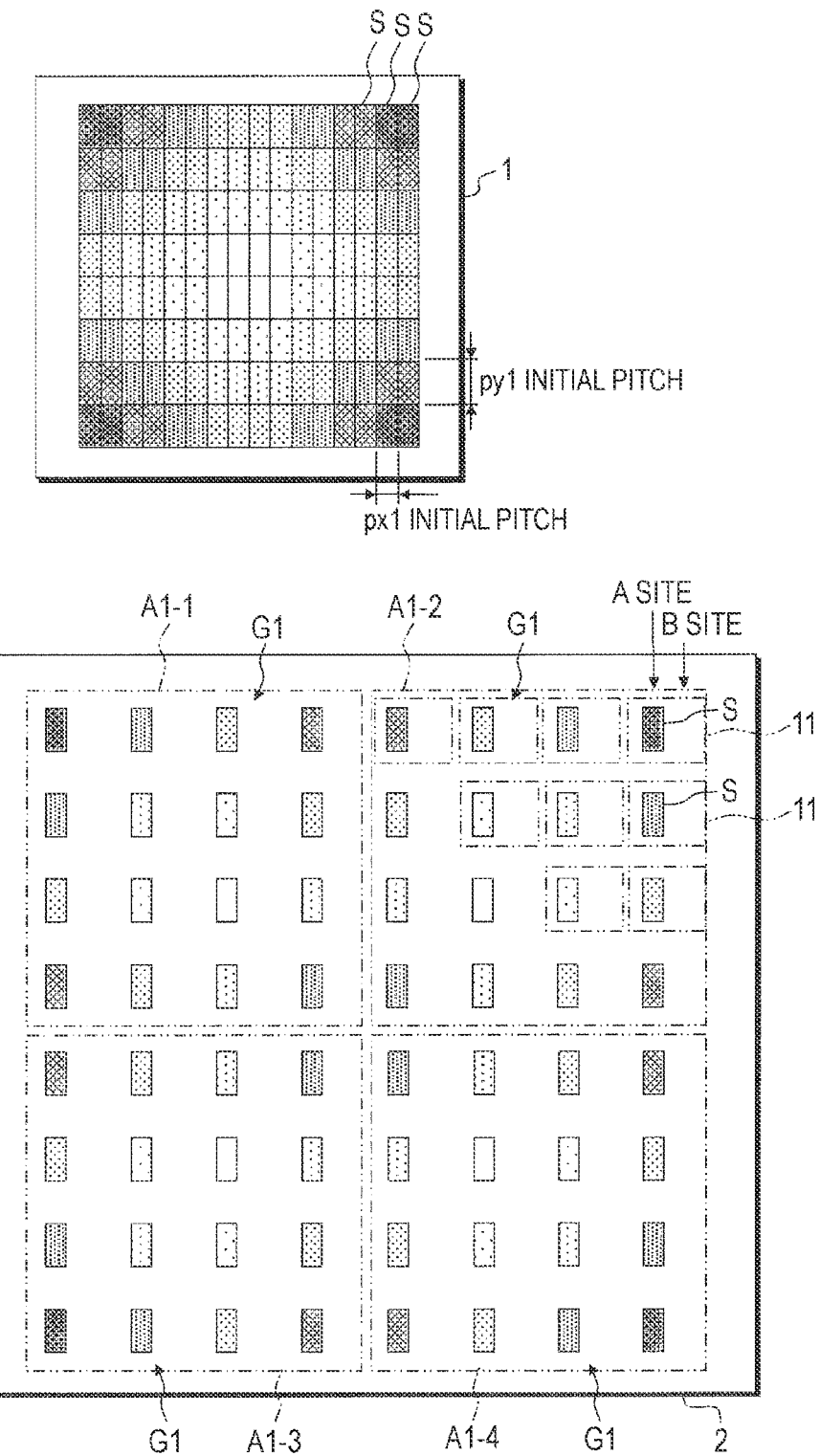

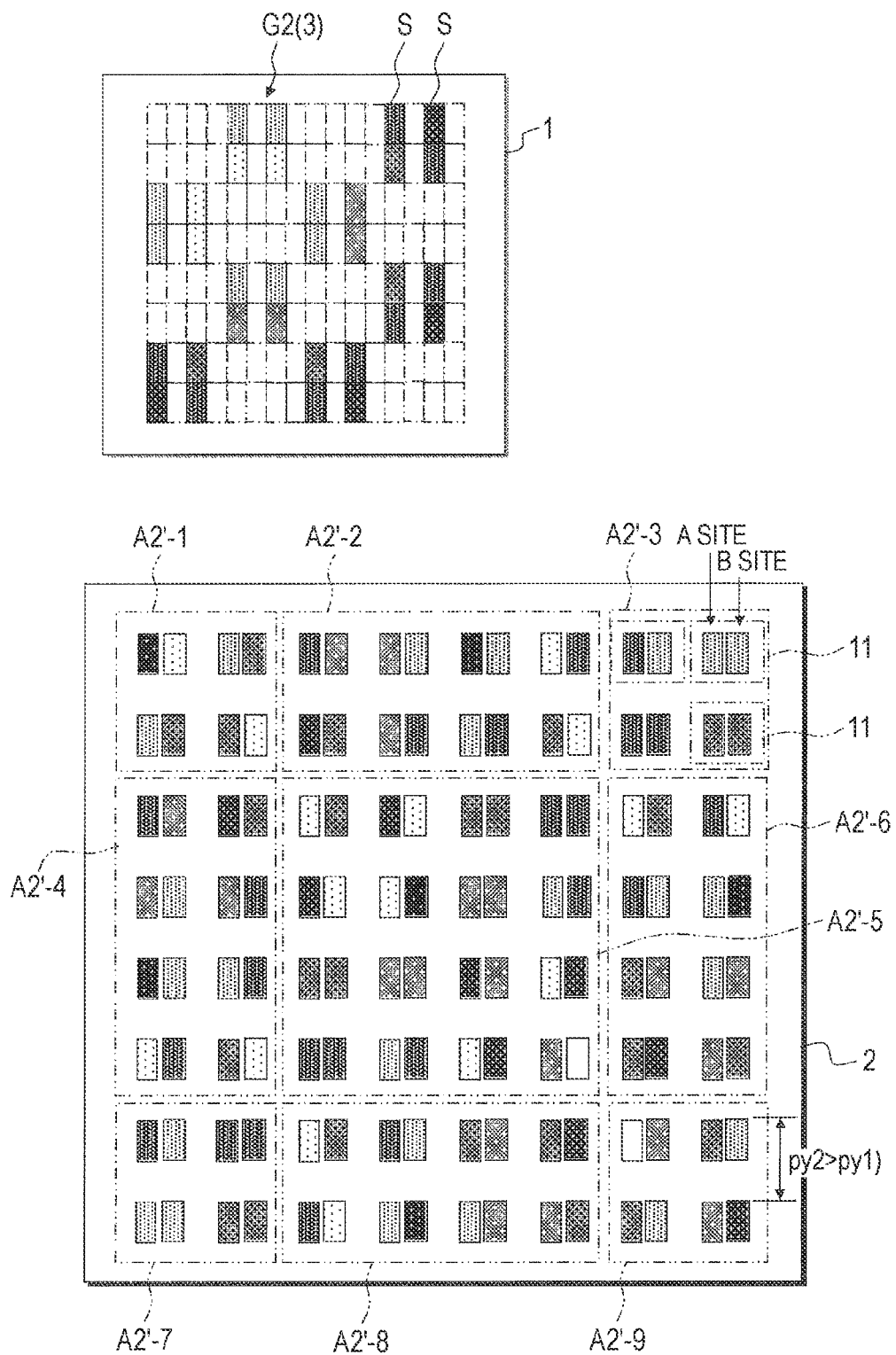

MANUFACTURING METHOD OF DISPLAY DEVICE AND DISPLAY DEVICE

BACKGROUND OF THE INVENTION

1. Field of the Invention

The present invention relates to a manufacturing method of a display device and a display device, and particularly to a manufacturing method of a display device in which light-emitting elements formed and arranged on a wafer are rearranged on a mounting substrate and a display device.

2. Description of the Related Art

In manufacture of a display device in which light emitting diodes (LEDs) are arranged in matrix form, a step is performed in which micro-size (several to several tens square) single crystal LEDs formed and arranged on a growth substrate (size of 50 to 150 mmφ) are mounted onto a device substrate. At this time, LEDs arranged at a pixel pitch period (integer times larger than an LED formation period) of the objective display device are selected from the growth substrate and are collectively transferred to the device substrate, and that is repeated, so that the display device having an objective size and the number of pixels can be fabricated.

For example, when LEDs arranged at a pitch of 20 μm on a growth substrate of 30 mm×30 mm are rearranged on a device substrate while the pitch is enlarged to 300 μm, one out of every 15 LEDs arranged on the growth substrate is selectively collectively transferred all over the growth substrate. By this, 100×100 LEDs are collectively transferred onto the device substrate at the pitch of 300 μm simultaneously.

Further, by repeating the similar collective transfer of LEDs remaining on the growth substrate to an area adjacent to the transferred area on the device substrate at the same period, one-color large display device can be formed from one growth substrate of 30 mm×30 mm (see, for example, JP-A-2006-140398 (patent document 1), (see paragraph 0017 and FIG. 1)).

SUMMARY OF THE INVENTION

In the formation of LEDs on the growth substrate, film formation of respective layers including a light emitting layer is generally performed by epitaxial crystal growth by MOCVD method. Particularly, with respect to a blue or green emission LED, it is necessary to form a very thin InGaN quantum well layer of several nm, and the light emission wavelength and the light emission efficiency of the LED much depend on the thickness and composition (In composition ratio).

However, in the epitaxial crystal growth by the MOCVD method, it is difficult to completely uniformly keep the temperature distribution of the growth substrate at the time of crystal growth and the flow of raw material and carrier gas in a plane, which are parameters for the thickness and the composition of the grown film. Thus, the LEDs formed on the growth substrate have the distribution of light emission wavelength (peak wavelength or dominant wavelength) of several nm in the substrate plane.

Accordingly, when the growth substrate on which the LEDs having the distribution as stated above are formed is used and the selective repetitive transfer is performed to fabricate the display device, the wavelength is periodically changed in the panel display plane in units of the size of one transfer area. When the change width (unevenness) of the peak wavelength or the dominant wavelength is about 2 nm or more, color unevenness is seen when visual inspection is performed. Besides, simultaneously, when monochromatic driving is performed by the same current on the whole surface, brightness unevenness is also seen due to the difference in visibility caused by the difference in light emission efficiency or the difference in wavelength. When the color unevenness or the brightness unevenness occurs, the display quality of the display is degraded, and its practicality is hampered.

In order to prevent the color unevenness or the brightness unevenness as stated above, there is also a method in which only LEDs whose brightness and emission wavelength is within the range of reference value are selected and arranged on the device substrate. However, as a personal or home image display device, it is necessary that a pixel pitch is less than 1 mm, and 0.3 to 2 million pixels are required. It is not practical in cost that LEDs of not less than 0.2 mm square are mounted one by one for such usage.

Thus, it is desirable to provide a manufacturing method of a display device in which while throughput is kept by applying collective transfer to simultaneously transfer plural elements, the distribution of emission characteristics in an initial element arrangement is diffused, and a display device having excellent picture quality can be obtained. Besides, it is desirable to provide a display device in which the picture quality is improved by the manufacturing method.

According to an embodiment of the present invention, there is provided a manufacturing method of a display device in which following steps are performed. First, in a first step, light-emitting elements arranged at every specified number of light-emitting elements formed and arranged on a first substrate are collectively transferred to a transfer area set on a second substrate. In a next second step, light-emitting elements remaining on the first substrate are transferred to between the plural light-emitting elements mounted on the second substrate from the first substrate by the first transfer. Especially, in the second step, the transfer is performed in at least one of a state where the first substrate is moved with respect to the transfer area on the second substrate and a state where the first substrate is rotated in a plane.

In the method of the embodiment of the present invention as stated above, even if the light-emitting elements are formed and arranged on the first substrate so that the emission characteristics are changed in a specified distribution, the light-emitting elements are transferred to between the light-emitting elements in the second step so as to cancel the distribution of the emission characteristics of the light-emitting elements collectively transferred on the substrate in the first step.

According to another embodiment of the present invention, there is provided a display device fabricated by the above manufacturing method, and including a first element group arranged on a substrate so that emission characteristics are changed in a specified distribution, and a second element group including plural light-emitting elements arranged between light-emitting elements constituting the first element group. Besides, the second element group is arranged in at least one of a state where an arrangement area is shifted in a plane with respect to the first element group and a state where an arrangement state of the first element group is rotated in a plane.

In the display device of the embodiment of the present invention, the distribution of the emission characteristics of the light-emitting elements constituting the first element group is cancelled by the distribution of the emission characteristics of the second element group.

As described above, according to the embodiments of the present invention, while the throughput is kept by applying the collective transfer to simultaneously transfer plural elements, the distribution of emission characteristics in the initial element arrangement is diffused, and a display device having an excellent display quality can be obtained.

BRIEF DESCRIPTION OF THE DRAWINGS

FIG. 5A is a plan view (No. 1) for explaining rearrangement in which a fifth embodiment is applied.

FIG. 7D is a plan view (No. 4) for explaining the rearrangement in which the seventh embodiment is applied.

DESCRIPTION OF THE PREFERRED EMBODIMENTS

Hereinafter, embodiments of the present invention will be described in the following order.

1. First embodiment (example of rearranging light-emitting elements arranged in a distribution where emission characteristics are changed from the center to both sides)

2. Second embodiment (example of rearranging light-emitting elements arranged in a distribution where emission characteristics are changed radially from the center)

3. Third embodiment (example of rearranging light-emitting elements arranged in a distribution where emission characteristics are changed radially from one end corner)

4. Fourth embodiment (example of rearranging light emitting elements arranged in a distribution where emission characteristics are changed radially from the center deviated to the direction of one end corner)

5. Fifth embodiment (modified example of the first embodiment and the second embodiment in which two light-emitting elements constitute one pixel)

6. Sixth embodiment (modified example of the third embodiment in which two light-emitting elements constitute one pixel)

7. Seventh embodiment (modified example of the fourth embodiment in which two light-emitting elements constitute one pixel)

8. Eighth embodiment (manufacturing method of a display device to which the rearrangement of the first to the seventh embodiments is applied)

9. Ninth embodiment (circuit structure of a display device to which an embodiment of the invention is applied)

First Embodiment

Figure 1A:
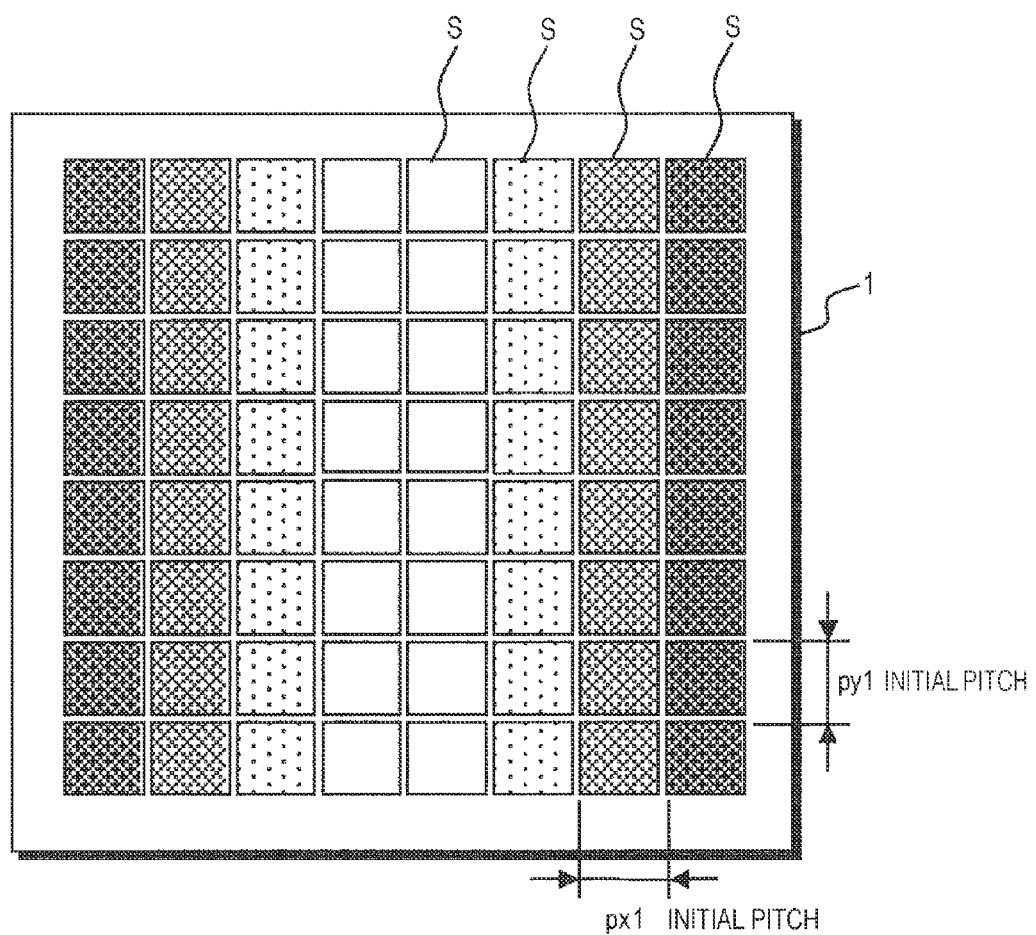
FIG. 1A is a plan view showing the emission characteristics distribution of light-emitting elements to which a first embodiment is applied.
Figure 1B:
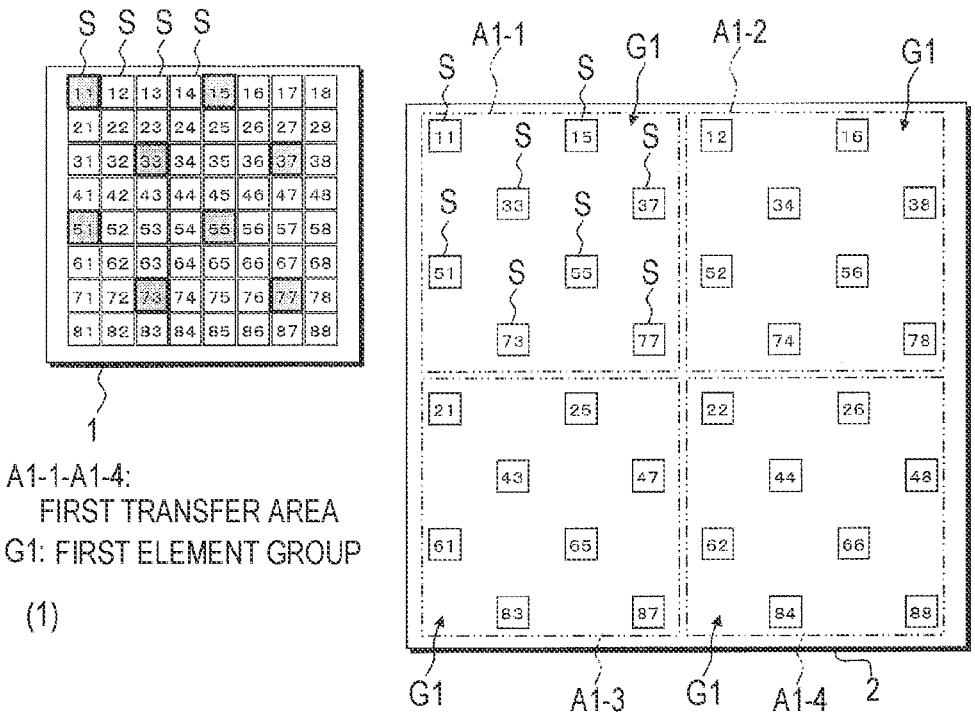
FIG. 1B is plan view for explaining rearrangement in which the first embodiment is applied.
Figure 1B:
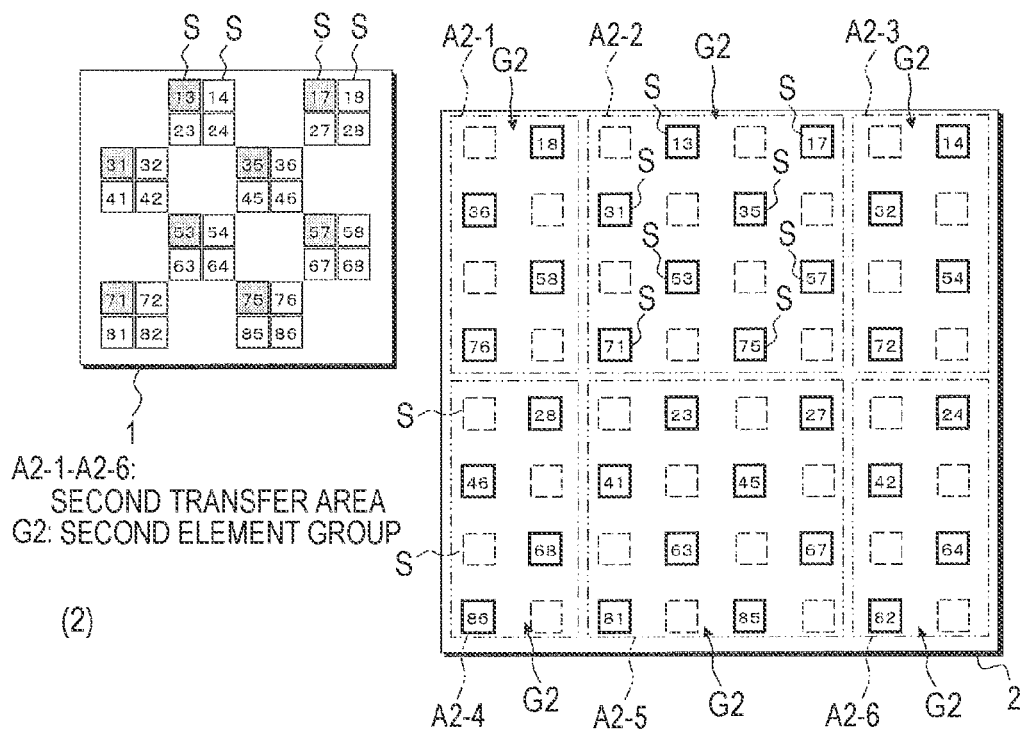
Figure 1C:
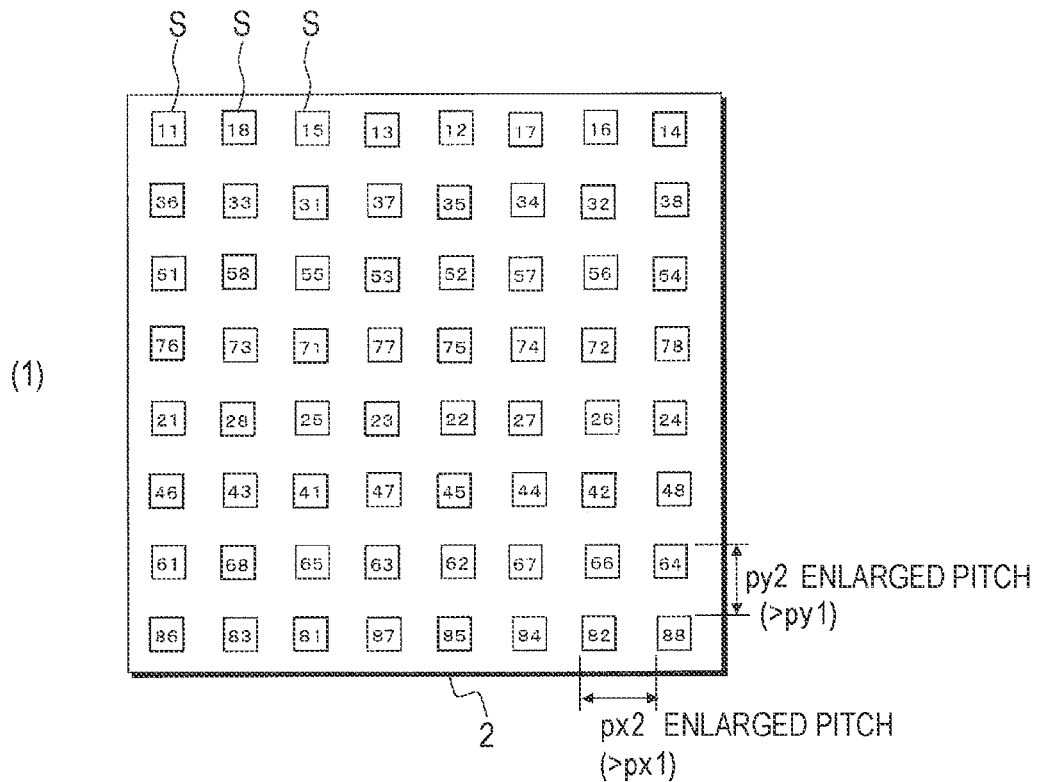
FIG. 1C is a plan view of a second substrate on which light-emitting elements are rearranged by applying the first embodiment.
Figure 1C:
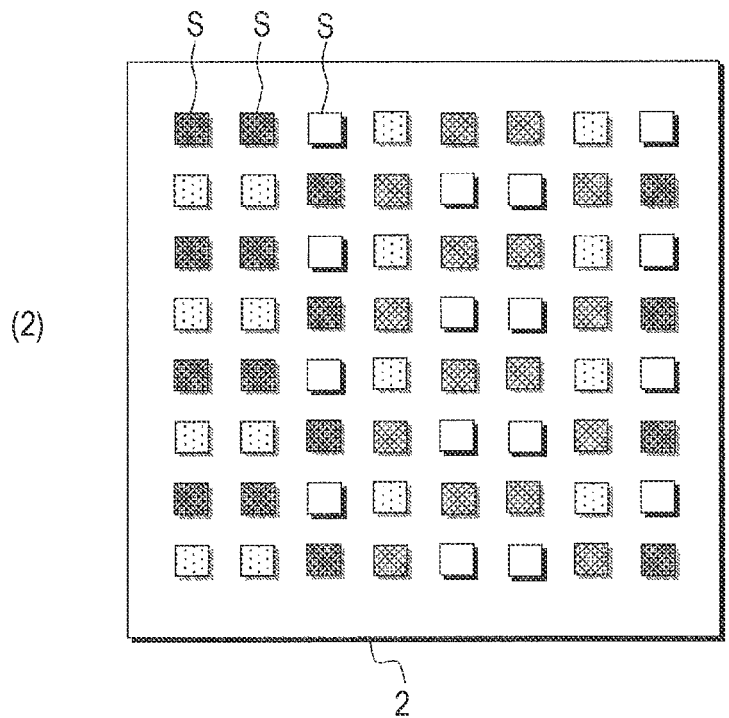

FIG. 1A to FIG. 1C are step views showing feature parts of a manufacturing method of a display device according to a first embodiment of the invention. Here, based on these drawings, a description will be made on a method of mounting light-emitting elements from a first substrate onto a second substrate in manufacture of a display device in which light-emitting elements such as light emitting diodes (LEDs) are arranged in matrix form.

Here, the first substrate is, for example, a growth substrate on which the light-emitting elements are formed or a holding substrate onto which the light-emitting elements formed and arranged on the growth substrate are temporarily mounted. The second substrate is a device substrate (wiring substrate)

on which wiring or the like is provided, or a hold substrate onto which the light-emitting elements are temporarily mounted.

A description will be made on a procedure in which light-emitting elements arranged on the first substrate at initial pitches of px1 and py1 are mounted onto the second substrate at enlarged pitches of px2 and py2 integer times larger than the initial pitches of px1 and py1. The enlarged pitch px2, py2 is corresponds to, for example, a pixel pitch. Incidentally, for explanation, it is assumed that the enlarged pitches px2 and py2 are twice the initial pitches px1 and py1. Besides, 64 light-emitting elements S arranged in 8 rows×8 columns on the first substrate are respectively given numbers including row numbers and column numbers of 11 to 88, and a specific light-emitting elements S is denoted by giving a number, for example, the light-emitting element at the first row and the first column is denoted by S11.

First, as shown in FIG. 1A, with respect to plural light-emitting elements S arranged at specified initial pitches px1 and py1 on the first substrate 1, the in-plane distribution of emission characteristics, such as chromaticity of emitted light or brightness, is detected. The emission characteristics detected here are an emission wavelength, emission brightness, a ratio of emission brightness in oblique direction to that in front direction, a rate of change of emission brightness to temperature change, and the like, and here, for example, the emission wavelength is detected.

As illustrated by the shading representing the emission characteristics of the respective light-emitting elements S, it is detected that the light-emitting elements S are arranged on the first substrate 1 in a distribution where the emission characteristics are changed from the center in a plane to both sides in the row direction as the right-and-left direction on the drawing. That is, it is detected that the wavelength distribution on the first substrate 1 is such that when the center in the longitudinal direction or the lateral direction (here, the longitudinal direction) on the first substrate 1 is made an axis, the wavelength is changed in one direction in dependence on the distance from this axis. In this case, the light-emitting elements S on the first substrate are mounted as described below.

First, in a first step shown in (1) in FIG. 1B, plural first transfer areas A1-1 to A1-4 each having the same size as the area of the first substrate 1 and adjacent to each other are set on a second substrate onto which the light-emitting elements S are mounted from the first substrate 1. Here, it is assumed that the second substrate 2 has an area 2×2 times larger than the first substrate 1 in the longitudinal direction and lateral direction.

The first substrate is arranged to be opposite to the first transfer areas A1-1 to A1-4 set on the second substrate, and the light-emitting elements S are successively collectively transferred by, for example, laser transfer described below.

At this time, first, the first substrate 1 is arranged to be opposite to the first transfer area A1-1. Then, laser light is selectively irradiated to light-emitting elements S11, S15, S51 and S55 arranged at every plural elements not less than two elements (here, three elements) on the first substrate 1 in the row and the column directions, and light-emitting elements S33, S37, S73 and S77 forming a check pattern together with these. By this, the 8 light-emitting elements S11, S15, . . . are collectively transferred and mounted onto the first transfer area A1-1 of the second substrate 2.

Next, the first substrate 1 is moved to the first transfer area A1-2 on the right and adjacent to the first transfer area A1-1. Then, laser light is selectively irradiated to light-emitting elements S12, S16, S52 and S56 and light-emitting elements S34, S38, S74 and S78, which are arranged on the right and adjacent to the light-emitting elements S11, S15, . . . on the first substrate 1. By this, the eight light-emitting elements S12, S16, . . . are collectively transferred and mounted onto the first transfer area A1-2 of the second substrate 2.

Similarly, also with respect to the first transfer area A1-3, the first substrate 1 is moved, and eight light-emitting elements S21, S25, . . . are collectively transferred and mounted. Besides, also with respect to the first transfer area A1-4, the first substrate 1 is moved and eight light-emitting elements S22, S26, . . . are collectively transferred and mounted.

The mounting of the light-emitting elements S by the collective transfer is performed in the state where the first substrate 1 is positioned on the first transfer areas A1-1 to A1-4, so that the arrangement of the respective light-emitting elements S mounted on the four first transfer areas A1-1 to A1-4 are aligned in the row direction and the column direction. Besides, the collective transfer of the light-emitting elements S to the four first transfer areas A1-1 to A1-4 may be performed in any order.

By the collective transfer in the first step, first element groups G1 in which the light-emitting elements S are arranged in the same emission characteristics distribution as that on the first substrate 1 are mounted in the respective first transfer areas A1-1 to A1-4 on the second substrate 2.

Next, in a second step shown in (2) in FIG. 1B, new transfer areas (second transfer areas) A2-1 to A2-6 are set on the second substrate 2. The second transfer areas A2-1 to A2-6 are positioned to be shifted from the first transfer areas (A1-1 to A1-4) set in the first step by half the size in the direction in which the emission characteristics of the light-emitting elements S are changed (right-and-left direction on the drawing and the row direction of the arrangement of the light-emitting elements S).

By this, each of the center second transfer areas A2-2 and A2-5 is set to have the same size (shape) as the first transfer area (A1-1 to A1-4) set on the first substrate in the first step. On the other hand, each of the second transfer areas A2-1, A2-3, A2-4 and A2-6 at the right-and-left both ends is set to have a size (shape) obtained by halving the center second transfer area A2-2, A2-5 in the row direction. Incidentally, when the second substrate 2 is sufficiently larger than the first substrate 1, most of the second transfer areas become the second transfer areas A2-2 and A2-5 set to have the same size (shape) as the first transfer areas (A1-1 to A1-4) set on the first substrate 1 in the first step.

The first substrate 1 is arranged to be opposite to the second transfer areas A2-1 to A2-6 on the second substrate 2, and the light-emitting elements S are successively collectively transferred by, for example, laser transfer described below.

For example, first, the first substrate 1 is arranged to be opposite to the center second transfer area A2-2. Then, laser light is selectively irradiated to light-emitting elements S13, S17, S53 and S57 arranged at every three elements on the first substrate 1 in the row direction and the column direction and light-emitting elements S31, S35, S71 and S75 forming a check pattern together with these. By this, the eight light-emitting elements S13, S17, . . . are collectively transferred and mounted onto the second transfer area A2-2 of the second substrate 2.

Next, the first substrate 1 is moved to the second transfer area A2-3 on the right and adjacent to the second transfer area A2-2. Then, laser light is selectively irradiated to light-emitting elements S14, S32, S54 and S72 arranged on the first substrate 1 overlapping with the second transfer area A2-3 and on the right and adjacent to the light-emitting elements S13, S17 . . . previously transferred to the second transfer area A2-2. By this, the four light-emitting elements A14, S32, S54 and S72 are collectively transferred and mounted onto the second transfer area A2-3 of the second substrate 2.

Similarly, also with respect to the second transfer areas A2-1, and A2-4 to A2-6, the first substrate 1 is moved, and four or eight light-emitting elements S are collectively transferred and mounted.

The mounting of the light-emitting elements S by the six collective transfers is performed in the state where the first substrate 1 is positioned on the respective second transfer areas A2-1 to A2-6 so that each of the light-emitting elements S is uniformly arranged in a nesting shape at the center between the light-emitting elements S mounted on the second substrate 2 in the first step. Further, the positioning is performed so that the arrangements of the respective light-emitting elements S transferred to the six second transfer areas A2-1 to A2-6 are aligned in the row direction and the column direction. Incidentally, the six collective transfers may be performed in any order.

Besides, by the collective transfer in the second step, second element groups G2 in which the light-emitting elements S are arranged in the same emission characteristics distribution as that on the first substrate 1 are provided in the respective second transfer areas A2-1 to A2-6 on the second substrate 2.

By the above, the 64 light-emitting elements S11 to S88 arranged on the first substrate 1 in 8 rows×8 columns at the initial pitches px1 and py1 are rearranged on the second substrate 2 in 8 rows×8 columns at the enlarged pitches px2 and py2 integer times larger than the initial pitches px1 and py1.

FIG. 1C shows a state where the plural light-emitting elements S are rearranged and mounted onto the second substrate 2 in the manner as described above. (1) in FIG. 1C shows numbers given to the respective light-emitting elements S, and (2) in FIG. 1C shows the emission characteristics of the respective light-emitting elements S by shading.

As described above, the 64 light-emitting elements S11 to S88 arranged on the first substrate 1 in 8 rows×8 columns at the initial pitches px1 and py1 are rearranged on the second substrate 2 in 8 rows×8 columns at the enlarged pitches px2 and py2 twice as larger as the initial pitches px1 and py1.

The light-emitting elements S11 to S88 rearranged on the second substrate 2 are classified into the first element groups G1 mounted in the first step shown in (1) in FIG. 1B and the second element groups G2 mounted in the second step shown in (2) in FIG. 1B.

The first element groups G1 are respectively arranged in the respective arrangement areas (that is, the first transfer areas A1-1 to A1-4, and hereinafter referred to as the first transfer areas) adjacent to each other on the second substrate 2. Beside, the second element groups G2 are respectively arranged in the respective arrangement areas (that is, the second transfer areas A2-1 to A2-6, and hereinafter referred to as the second transfer areas) adjacent to each other on the second substrate 2.

The light-emitting elements S constituting the first element groups G1 and the second element groups G2 are arranged in the same emission characteristics distribution as the light-emitting elements S on the first substrate 1. That is, the distribution is such that the emission characteristics are changed from the in-plane center of each of the transfer areas (arrangement areas) in which the first element groups G1 and the second element groups G2 are arranged to both the sides. However, among the second element groups G2, the second element group G2 arranged at the periphery of the second substrate 2 has the emission characteristics distribution cut along the shape of the transfer area.

Besides, the first transfer areas A1-1 to A1-4 in which the first element groups G1 are provided and the second transfer areas A2-1 to A2-6 in which the second element groups G2 are provided are provided on the second substrate 2 in the state where they are shifted from each other by half the size in the direction where the emission characteristics are changed. Thus, the light-emitting elements S constituting the first element groups G1 arranged in the respective first transfer areas A1-1 to A1-4 and the light-emitting elements S constituting the second element groups G2 arranged in the respective second transfer areas A2-1 to A2-6 are arranged in the nesting shape.

According to the first embodiment, the light-emitting elements S arranged in the distribution where the emission characteristics are changed from the in-plane center of the first substrate 1 to both the sides can be rearranged on the second substrate 2 so as to cancel the emission characteristics distribution while the collective transfer is applied. That is, the light-emitting elements S on the first substrate 1, which are positioned at places spaced by half the size thereof in the row direction (lateral direction), are mounted as the light-emitting elements S adjacent to each other in the row direction (lateral direction) on the second substrate 2. Thus, the distribution where the emission characteristics are changed from the in-plane center of the first substrate 1 to both the sides is cancelled between the light-emitting elements S adjacent to each other on the second substrate 2. Besides, when the number of light-emitting elements S is large, the light-emitting elements are mounted onto the second substrate 2 in the state where the light-emitting elements S having characteristics at both sides of the characteristic average value of all the light-emitting elements S are adjacent to each other.

Especially, since the spatial resolution of color difference in human visual characteristics is lower than that of brightness difference, when an image of the display device fabricated in the arrangement of the light-emitting elements S on the second substrate 2 is seen from a place spaced by a recommended visual distance or more, the color difference between the adjacent pixels is hard to recognize. The image is recognized by color obtained by averaging approximately 2×2 pixels, in other words, it is recognized in the state where a spatial low-pass filter is used with respect to color. By this, the original color unevenness (color difference in the whole display device) is seemingly reduced to ½ or less.

Besides, the arrangement interval of the arrangement of the light-emitting elements S on the first substrate 1 is enlarged to the intervals px2 and py2 from the specified initial pitches px1 and py1, and the rearrangement can be performed at the enlarged intervals.

As a result of the above, the display device having excellent display quality can be obtained in which while the throughput is kept by using the collective transfer, the distribution of emission characteristics in the initial element arrangement is diffused, and visual recognition of color unevenness is prevented.

Besides, according to the embodiment of the invention, since the visual recognition of color unevenness is suppressed, as compared with a basic repetitive selection transfer method, the allowable value of unevenness of emission dominant wavelength of the light-emitting elements formed and arranged on the growth substrate can be made twice or more. Besides, since a correcting circuit to correct the color unevenness can be eliminated or can be simplified, the power consumption and cost of the display device can be reduced. Further, as compared with a case where the color unevenness is corrected by signal processing, a color reproduction range can be widened.

Further, as compared with a case where the method of the embodiment is not used, the growth substrate of light-emitting elements having larger wavelength unevenness can be used, and the effective area of the growth substrate can be effectively used. Accordingly, the cost of the display device can be reduced.

Figure 1D:
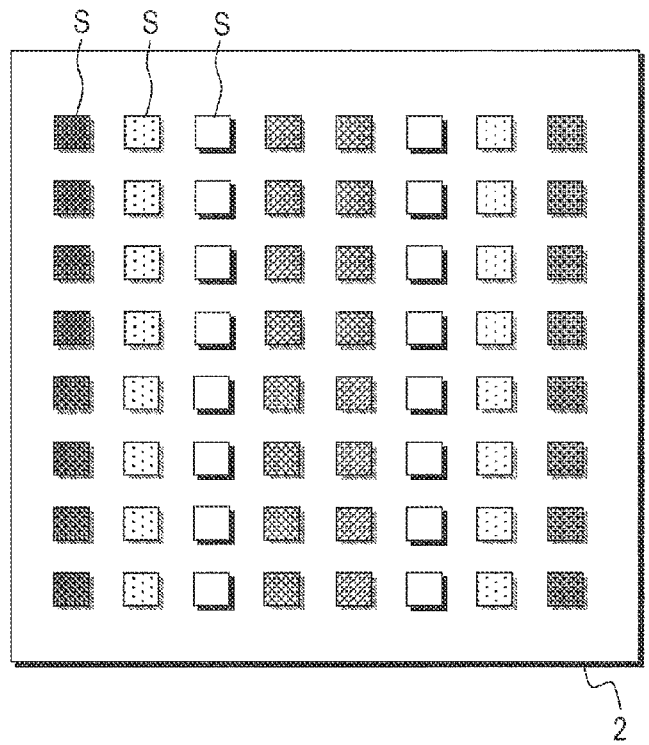
FIG. 1D is a plan view of a second substrate on which light-emitting elements are rearranged by a general procedure.

Incidentally, for comparison, in FIG. 1D, a state in which light-emitting elements S are mounted onto the second substrate 2 by applying general collective transfer is shown by the shading representing the emission characteristics of the light-emitting elements S. Here, the general collective transfer is a method in which the light-emitting elements S on the first substrate 1 arranged at every other element in the row and the column directions are collectively transferred to the areas obtained by dividing the second substrate 2 into four in the row and the column directions. As shown in FIG. 1D, it is understood that according to the general collective transfer, in the four divided areas on the second substrate 2, the state remains in which the light-emitting elements S are arranged in the distribution where the emission characteristics are changed from the center to both the sides.

Second Embodiment

Figure 2A:
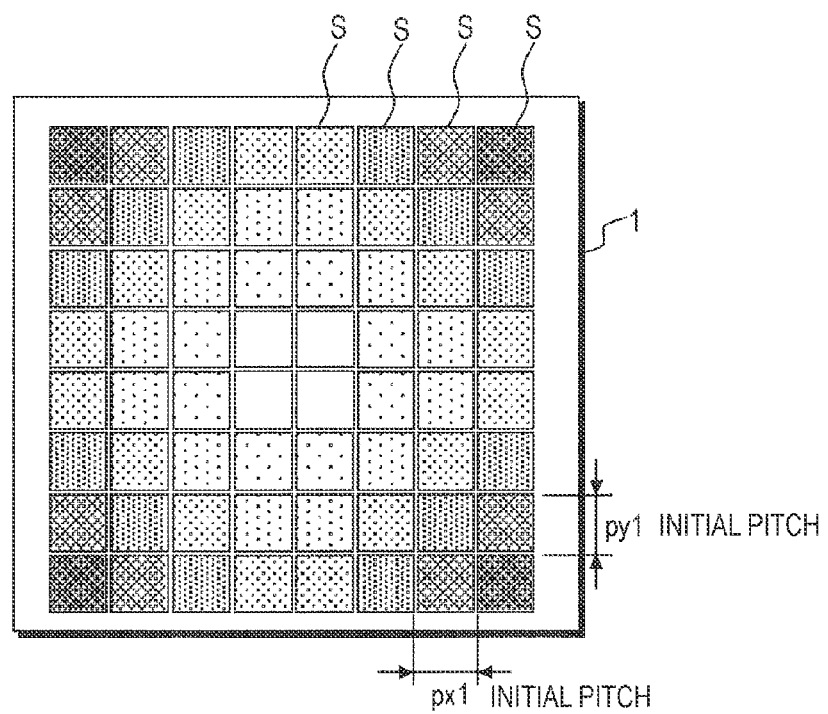
FIG. 2A is a plan view showing the emission characteristics distribution of light-emitting elements to which a second embodiment is applied.
Figure 2B:
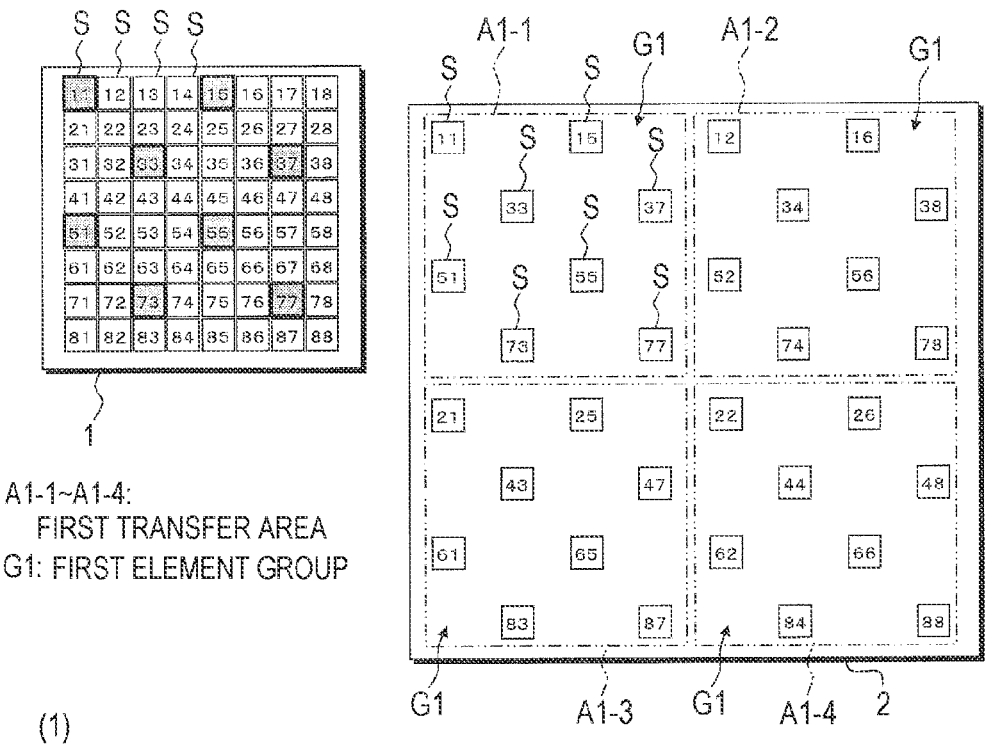
FIG. 2B is a plan view for explaining rearrangement in which the second embodiment is applied.
Figure 2B:
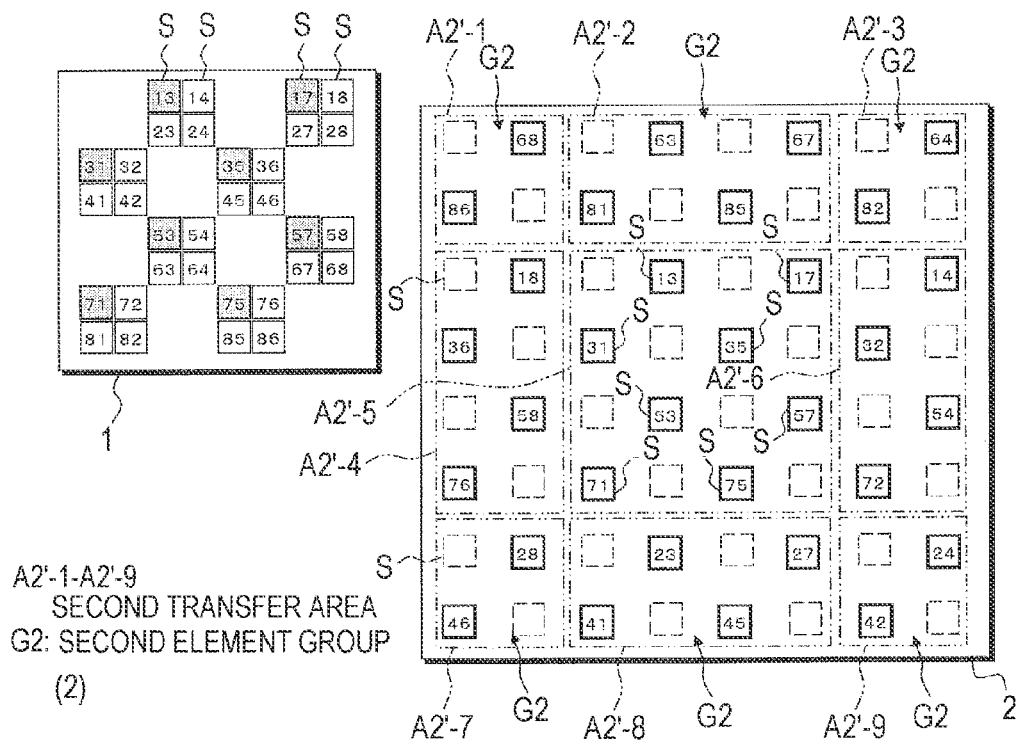
Figure 2C:
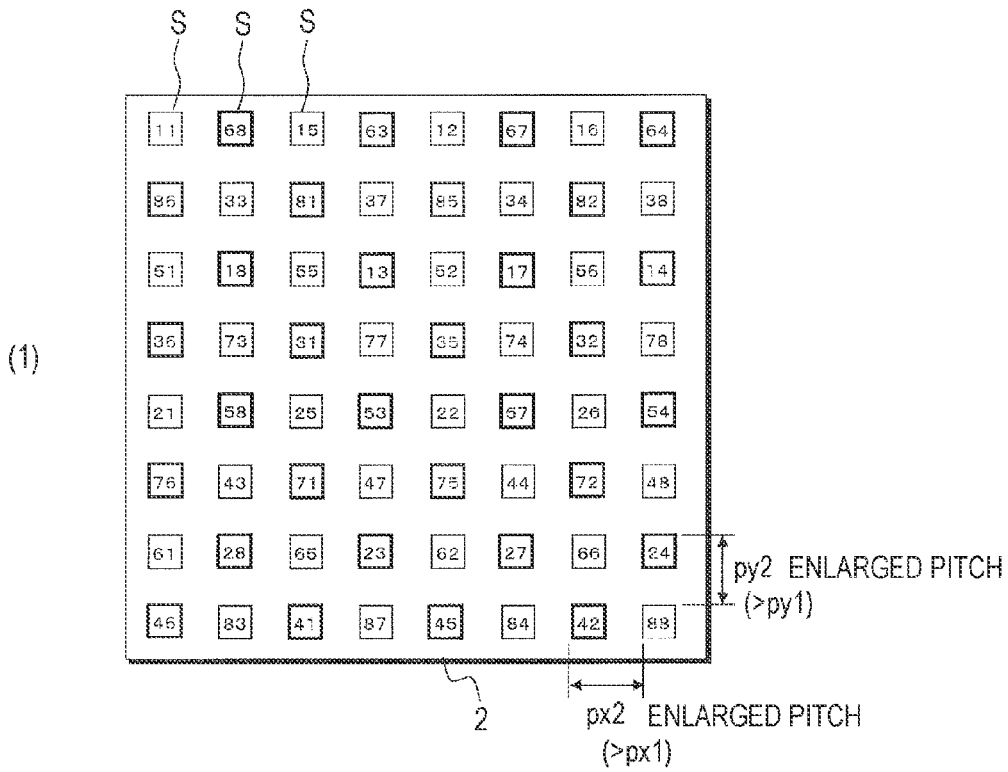
FIG. 2C is a plan view of a second substrate on which light-emitting elements are rearranged by applying the second embodiment.
Figure 2C:
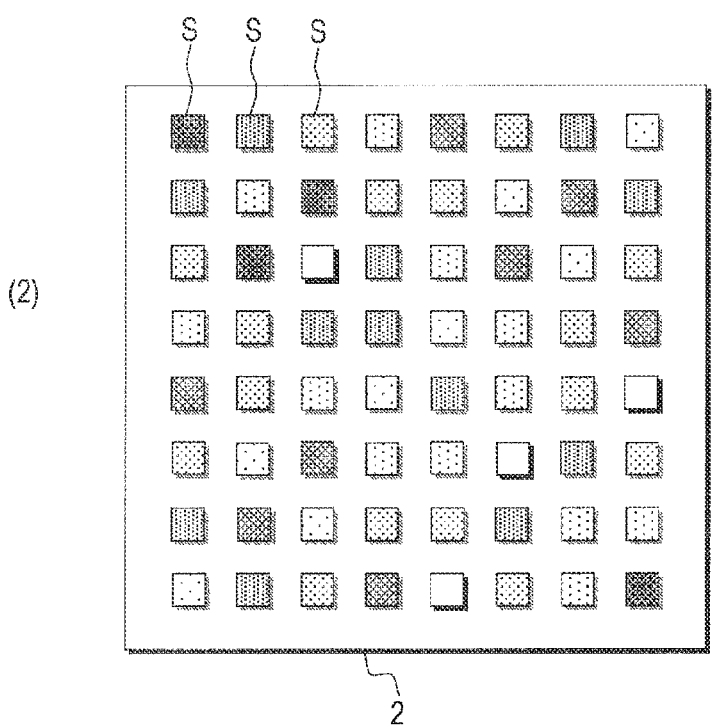

FIG. 2A to FIG. 2C are step views showing feature parts of a manufacturing method of a display device according to a second embodiment of the invention. The second embodiment is an applied example of the first embodiment. Hereinafter, similarly to the first embodiment, a method of mounting light-emitting elements from a first substrate onto a second substrate in manufacture of the display device will be described with reference to these drawings.

First, as shown in FIG. 2A, an in-plane distribution of emission characteristics (here, emission wavelength), such as chromaticity of emitted light or brightness, is detected with respect to plural light-emitting elements S arranged on the first substrate 1 at specified initial pitches px1 and py1.

By this, as indicated by the shading representing the emission characteristics of the respective light-emitting elements S, it is detected that the light-emitting elements S are arranged on the first substrate 1 in the distribution where the emission characteristics are changed radially from the center to the outside. That is, it is detected that the wavelength distribution on the first substrate 1 is represented by an approximately axisymmetric monotone function, that is, the wavelength distribution is such that in circular polar coordinates where the center of the first substrate 1 is the origin, the wavelength at the center is short and the wavelength becomes long toward the periphery in dependence on the distance from the center irrespective of an azimuth, and vice versa. The distribution of the emission characteristics as stated above occurs in dependence on the rotation of the substrate to raise the uniformity of composition and film thickness at the time of crystal growth when the light-emitting elements S are formed. In this case, the light-emitting elements S on the first substrate 1 are mounted as described below.

First, a first step shown in (1) in FIG. 2B is performed similarly to the first embodiment. That is, first transfer areas A1-1 to A1-4 are set on the second substrate 2 onto which the light-emitting elements S are mounted from the first substrate 1. Among the light-emitting elements S arranged on the first substrate 1, light-emitting elements S arranged at every specified number of elements are collectively transferred to the respective first transfer areas A1-1 to A1-4. By this, first element groups G1 in which the light-emitting elements S are arranged in the same emission characteristics distribution as that on the first substrate 1 are mounted into the respective first transfer areas A1-1 to A1-4 on the second substrate 2.

Next, in a second step shown in (2) in FIG. 2B, new transfer areas (second transfer areas) A2'-1 to A2'-9 are set on the second substrate 2. With respect to the first transfer areas (A1-1 to A1-4) set in the first step, the second transfer areas A2'-1 to A2'-9 are set at positions shifted by half the size in the longitudinal direction and the lateral direction, that is, in the row direction and the column direction of the arrangement of the light-emitting elements S.

By this, the center second transfer area A2'-5 is set to have the same size (shape) as the first transfer areas (A1-1 to A1-4) set on the first substrate 1 in the first step. On the other hand, the second transfer areas A2'-2, A2'-4, A2'-6 and A2'-8 arranged on the periphery of the second substrate 2 are set to have the size (shape) obtained by halving the center second transfer area A2'-5 in the row direction or the column direction. Further, the second transfer areas A2'-1, A2'-3, A2'-7 and A2'-9 arranged at the corners of the second substrate 2 are set to have the size (shape) obtained by dividing the center second transfer area A2'-5 into four in the row and the column directions. Incidentally, when the second substrate 2 is sufficiently larger than the first substrate 1, most of the second transfer areas become the second transfer areas A2'-5 set to have the same size (shape) as the first transfer areas (A1-1 to A1-4) set on the first substrate 1 in the first step.

The first substrate 1 is arranged to be opposite to the second transfer areas A2'-1 to A2'-9 on the second substrate 2 set as described above and the light-emitting elements S are successively collectively transferred.

For example, first, the first substrate 1 is arranged to be opposite to the center second transfer area A2'-5. Then, laser light is selectively irradiated to the light-emitting elements S13, S17, S53 and S57 arranged at every three elements in the row direction and the column direction on the first substrate 1 and the light-emitting elements S31, S35, S71 and S75 forming a check pattern together with these. By this, the eight light-emitting elements S13, S17, . . . are collectively transferred and mounted onto the second transfer area A2'-5 of the second substrate 2.

Next, the first substrate 1 is moved to the second transfer area A2'-6 on the right and adjacent to the second transfer area A2'-5. Then, laser light is selectively irradiated to the light-emitting elements S14, S32, S54 and S72 arranged on the first substrate 1 overlapping with the second transfer area A2'-6 and arranged on the right and adjacent to the light-emitting elements S13, S17 . . . previously transferred to the second transfer area A2'-5. By this, these four light-emitting elements S14, S32, S54 and S72 are collectively transferred and mounted to the second transfer area A2'-6 of the second substrate 2.

Similarly, the first substrate 1 is moved to the second transfer areas A2'-1 to A2'-4, and A2'-7 to A2'-9. Then, four or two light-emitting elements S arranged on the first substrate 1 overlapping with the respective second transfer areas A2'-1 to A2'-4, and A2'-7 to A2'-9 are collectively transferred and mounted.

The mounting of the light-emitting elements S by the nine collective transfers is performed in the state where the first substrate 1 is positioned with respect to the second transfer areas A2'-1 to A2'-9 so that the respective light-emitting elements S are arranged uniformly in a nesting shape at the center between the light-emitting elements S already mounted onto the second substrate 2 in the first step. Further, the positioning is performed so that the arrangements of the respective light-emitting elements S transferred to the nine second transfer areas A2'-1 to A2'-9 are aligned in the row direction and the column direction. Incidentally, the nine collective transfers may be performed in any order.

Besides, by the collective transfer in the second step, second element groups G2 in which the light-emitting elements S are arranged in the same emission characteristics distribution as that on the first substrate 1 are provided in the respective second transfer areas A2'-1 to A2'-9 on the second substrate 2.

By the above, the 64 light-emitting elements S11 to S88 arranged on the first substrate 1 in 8 rows×8 columns at the initial pitches px1 and py1 are rearranged on the second substrate 2 in 8 rows×8 columns at enlarged pitches px2 and py2 integer times larger than the initial pixel pitches px1 and py1.

FIG. 2C shows a state in which the plural light-emitting elements S are rearranged and mounted on the second substrate 2 in the manner as described above. FIG. (1) in 2C shows numbers given to the light-emitting elements S, and (2) in FIG. 2C shows the emission characteristics of the respective light-emitting elements S by shading.

Similarly to the first embodiment, the 64 light-emitting elements S11 to S88 arranged on the first substrate 1 in 8 rows×8 columns at the initial pitches px1 and py1 are rearranged on the second substrate 2 in 8 rows×8 columns at the enlarged pitches px2 and py2 twice as large as the initial pitches px1 and py1.

The light-emitting elements S11 to S88 rearranged on the second substrate 2 are classified into the first element groups G1 mounted in the first step shown in (1) in FIG. 2B and the second element groups G2 mounted in the second step shown in (2) in FIG. 2B.

The first element groups G1 are respectively arranged in the respective adjacent arrangement areas (that is, the first transfer areas A1-1 to A1-4 and hereinafter referred to as the first transfer areas) on the second substrate 2. Besides, the second element groups G2 are respectively arranged in the respective adjacent arrangement areas (that is, the second transfer areas A2'-1 to A2'-9 and hereinafter referred to as the second transfer areas) on the second substrate 2.

The light-emitting elements S constituting the first element groups G1 and the second element groups G2 are arranged to have the same emission characteristics distribution as that of the light-emitting elements S on the first substrate 1. That is, the distribution is such that in the plane of each of the transfer areas (arrangement areas) where the first element groups G1 and the second element groups G2 are arranged, the emission characteristics is changed radially from the center to the outside. However, among the second element groups G2, the second element group G2 arranged at the periphery of the second substrate 2 has the emission characteristics distribution cut along the shape of the transfer area.

Besides, with respect to the first transfer areas A1-1 to A1-4 where the first element groups G1 are provided, the second transfer area A2'-1 to A2'-9 where the second element groups G2 are provided are overlapped therewith in the state where they are shifted by half the size in the row direction and the column direction of the arrangement of the light-emitting elements S. Thus, the light-emitting elements S constituting the first element groups G1 arranged in the first transfer areas A1-1 to A1-4 and the light-emitting elements S constituting the second element groups G2 arranged in the second transfer areas A2'-1 to A2'-9 are arranged in the nesting shape. Besides, the light-emitting elements S adjacently arranged on the second substrate 2 are the light-emitting elements S at places spaced by approximately half the transfer size in the vertical and the horizontal directions among the light-emitting elements S arranged on the first substrate 1.

According to the second embodiment, the light-emitting elements S arranged on the first substrate 1 in the distribution where the emission characteristics are changed radially from the center to the outside can be rearranged on the second substrate 2 so as to cancel the emission characteristics distribution while the collective transfer is applied to simultaneously transfer the plural elements. That is, the light-emitting elements S adjacent to each other in the row direction (lateral direction) and the column direction (longitudinal direction) on the second substrate 2 are the light-emitting elements S on the first substrate 1 at places spaced by half the size in the row direction (lateral direction) and the column direction (longitudinal direction). Thus, the distribution where the emission characteristics are changed radially from the center on the first substrate 1 to the outside is cancelled between the light-emitting elements S adjacent to each other on the second substrate 2. Accordingly, similarly to the first embodiment, the original color unevenness (color difference in the whole display device) can be seemingly reduced to ½ or less. Besides, when the number of light-emitting elements S on the first substrate 1 is large, the light-emitting elements are mounted onto the second substrate in the state where the light-emitting elements S having characteristics at both sides of a characteristic average value of all the light-emitting elements S are adjacent to each other.

Besides, the arrangement interval of the arrangement of the light-emitting elements S on the first substrate 1 is enlarged from the specified initial pitches px1 and py1 to the intervals px2 and py2, and the rearrangement can be performed at the enlarged intervals.

As a result, similarly to the first embodiment, the display device having excellent display quality can be obtained in which while the throughput is kept by applying the collective transfer, the distribution of the emission characteristics in the initial element arrangement is diffused, and visual recognition of color unevenness is prevented.

Figure 2D:
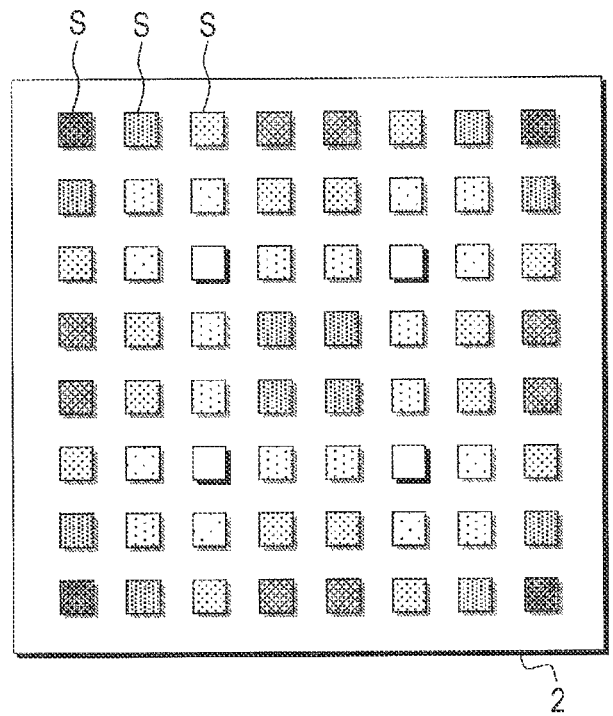
FIG. 2D is a plan view of a second substrate on which light-emitting elements are rearranged by a general procedure.

Incidentally, for comparison, in FIG. 2D, a state where light-emitting elements S are mounted onto the second substrate 2 by applying general collective transfer is shown by the shading representing the emission characteristics of the light-emitting elements S. Here, the general collective transfer is a method in which the light-emitting elements S on the first substrate 1 arranged at every other element in the row and the column directions are collectively transferred to the respective areas obtained by dividing the second substrate 2 into four in the row and the column directions. As shown in FIG. 2D, it is understood that according to the general collective transfer, in the four divided areas on the second substrate 2, the state remains in which the light-emitting elements S are arranged in the distribution where the emission characteristics are changed radially from the center to the outside.

Third Embodiment

Figure 3A:
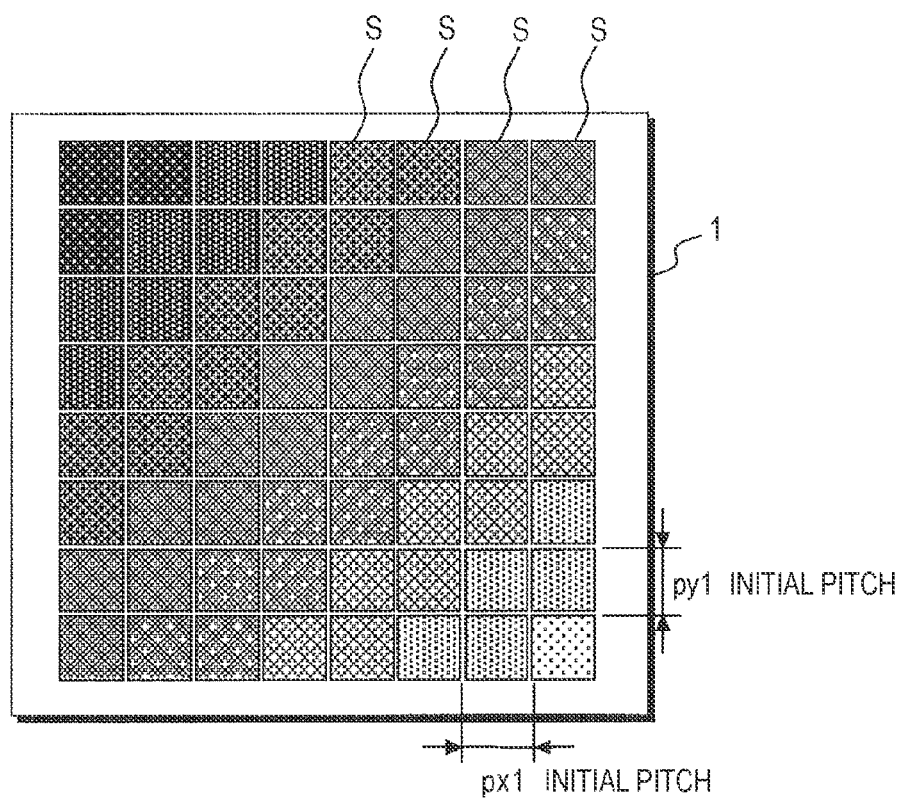
FIG. 3A is a plan view showing the emission characteristics distribution of light-emitting elements to which a third embodiment is applied.
Figure 3B:
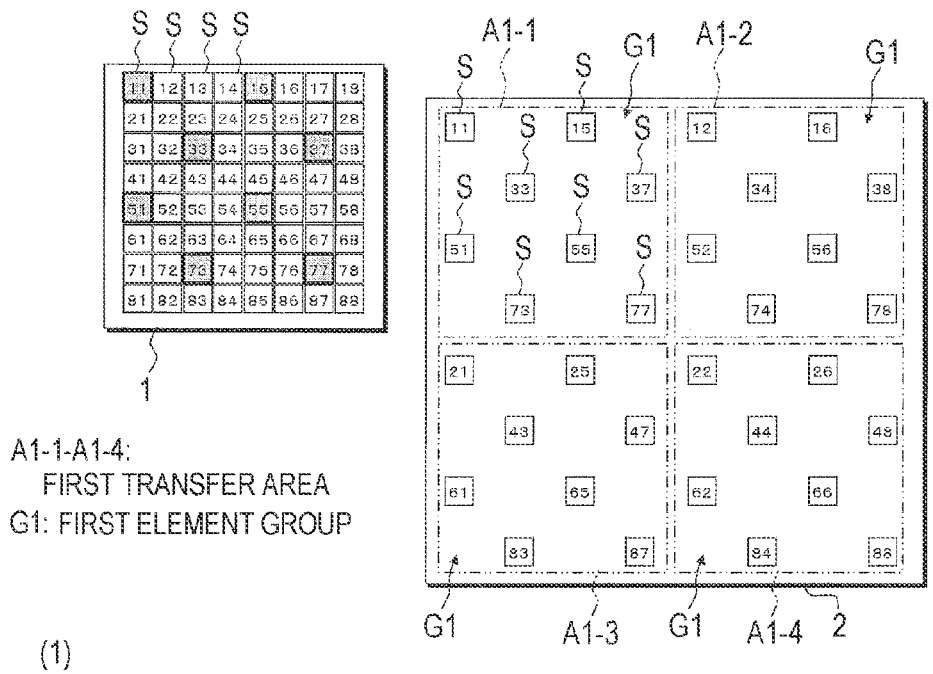
FIG. 3B is a plan view for explaining rearrangement in which the third embodiment is applied.
Figure 3B:
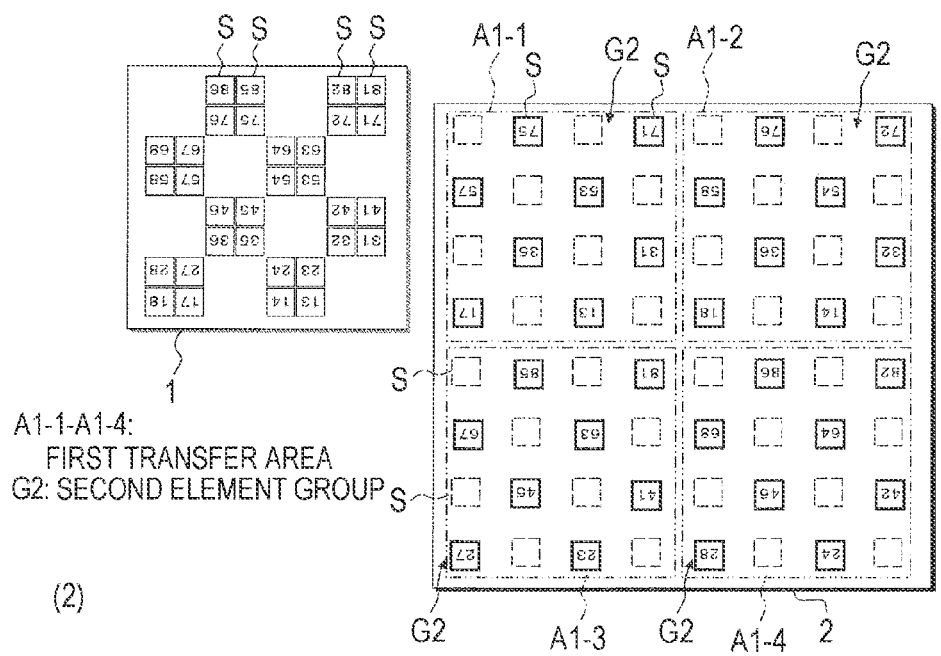
Figure 3C:
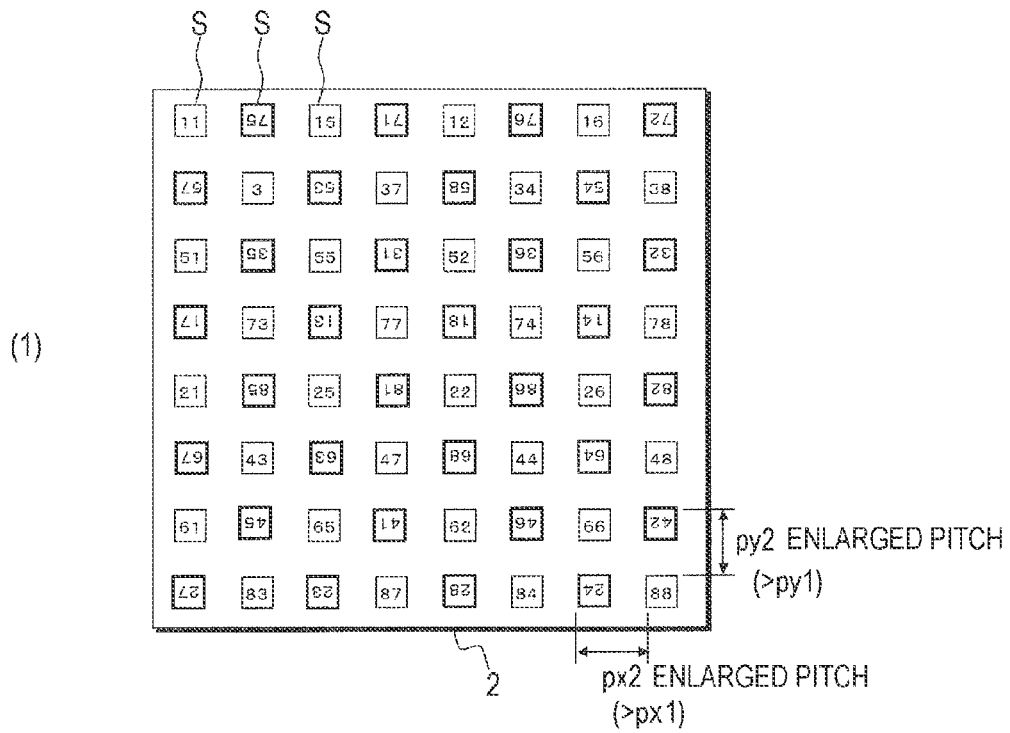
FIG. 3C is a plan view of a second substrate on which light-emitting elements are rearranged by applying the third embodiment.
Figure 3C:
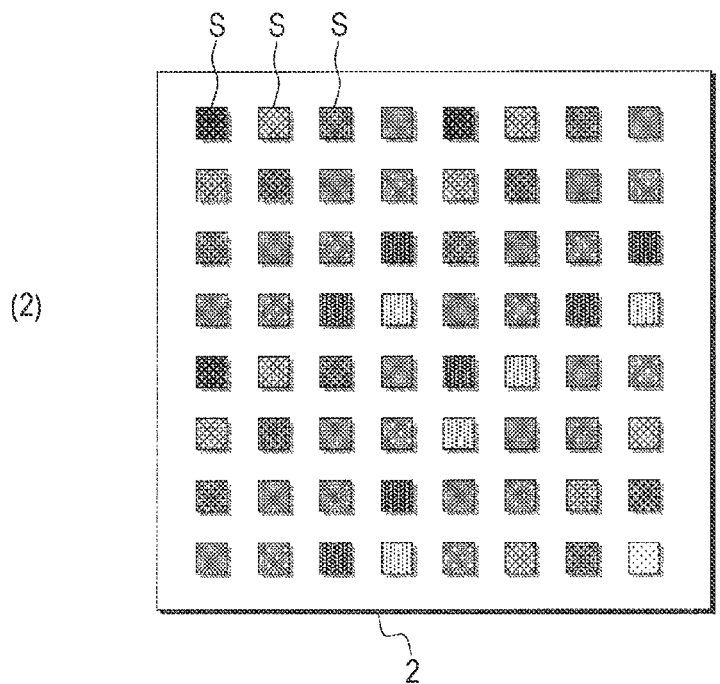

FIG. 3A to FIG. 3C are step views showing feature parts of a manufacturing method of a display device according to a third embodiment of the invention. Similarly to the first embodiment, a method of mounting light-emitting elements from a first substrate onto a second substrate in manufacture of the display device will be described with reference to these drawings.

First, as shown in FIG. 3A, an in-plane distribution of emission characteristics (here, emission wavelength), such as chromaticity of emitted light or brightness, is detected with respect to plural light-emitting elements S arranged on a first substrate 1 at specified initial pitches px1 and py1.

By this, as indicated by the shading representing the emission characteristics of the respective light-emitting elements S, it is detected that the light-emitting elements S are arranged on the first substrate 1 in the distribution where the emission characteristics are radially monotonously changed in one direction from one end corner in a plane. In this cases, the light-emitting elements S on the first substrate 1 are mounted as described below.

First, a first step shown in (1) in FIG. 3B is performed similarly to the first embodiment. That is, first transfer areas A1-1 to A1-4 are set on the second substrate 2 to which the light-emitting elements S are mounted from the first substrate 1. Among the light-emitting elements S arranged on the first substrate 1, light-emitting elements S arranged at every specified number of elements are collectively transferred to the respective first transfer areas A1-1 to A1-4. By this, first element groups G1 in which the light-emitting elements S are arranged in the same emission characteristics distribution as that on the first substrate 1 are mounted into the respective first transfer areas A1-1 to A1-4.

Next, in a second step shown in (2) in FIG. 3B, with respect to the first transfer areas A1-1 to A1-4 set in the first step, the first substrate 1 is rotated by 180° in a plane. Then, the light-emitting elements S are successively collectively transferred by, for example, laser transfer to the respective first transfer areas A1-1 to A1-4 on the second substrate 2.

For example, first, the first substrate 1 rotated by 180° is arranged to be opposite to the first transfer area A1-1. Then, laser light is selectively irradiated to the light-emitting elements S13, S17, S53 and S57 arranged at every three elements in the row direction and the column direction on the first substrate 1, and light-emitting elements S31, S35, S71 and S75 forming a check pattern together with these. By this, the eight light-emitting elements S13, S17, . . . are collectively transferred to the first transfer area A1-1 of the second substrate 2.

Next, the first substrate 1 rotated by 180° is moved to the first transfer area A1-2 on the right and adjacent to the first transfer area A1-1. Then, laser light is selectively irradiated to the light-emitting elements S14, S18, S54 and S58 arranged on the right and adjacent to the light-emitting elements S13, S17 . . . previously transferred to the first transfer area A1-1, and the light-emitting elements S32, S36, S72 and S76 forming a check pattern together with these. By this, these eight light-emitting elements S14, S17, . . . are collectively transferred and mounted onto the first transfer area A1-2 of the second substrate 2.

Similarly, the first substrate 1 rotated by 180° is moved also to the first transfer areas A1-3 and A1-4, and the eight light-emitting elements S are collectively transferred and mounted.

The mounting of the light-emitting elements S by the four collective transfers is performed in the state where the first substrate 1 is positioned with respect to the respective first transfer areas A1-1 to A1-4 so that the respective light-emitting elements S are arranged uniformly at the center between the light-emitting elements S already mounted onto the second substrate 2 in the first step. Further, the positioning is performed so that the arrangements of the respective light-emitting elements S transferred to the four first transfer areas A1-1 to A1-4 are aligned in the row direction and the column direction. Incidentally, the four collective transfers may be performed in any order.

Besides, by the collective transfer in the second step as described above, second element groups G2 in which the first element groups G1 mounted in the first step are rotated by 180° are provided in the respective first transfer areas A1-1 to A1-4 on the second substrate 2.

From the above, the 64 light-emitting elements S11 to S88 arranged on the first substrate 1 in 8 rows×8 columns at the initial pitches px1 and py1 are rearranged on the second substrate 2 in 8 rows×8 columns at the enlarged pitches px2 and py2 integer times (twice) as large as the initial pitches px1 and py1.

FIG. 3C shows a state where the plural light-emitting elements S are rearranged and mounted onto the second substrate 2 in the manner as described above. (1) in FIG. 3C shows numbers given to the light-emitting elements S, and (2) in FIG. 3C shows the emission characteristics of the respective light-emitting elements S by shading.

Similarly to the first embodiment, the 64 light-emitting elements S11 to S88 arranged on the first substrate 1 in 8 rows×8 columns at the initial pitches px1 and py1 are rearranged on the second substrate 2 in 8 rows×8 columns at the enlarged pitches px2 and py2 twice as large as the initial pitches px1 and py1.

The light-emitting elements S11 to S88 rearranged on the second substrate 2 are classified into the first element groups G1 mounted in the first step shown in (1) in FIG. 3B and the second element groups G2 mounted in the second step shown in (2) in FIG. 3B.

The light-emitting elements S constituting the first element groups G1 and the second element groups G2 are arranged in the same emission characteristics distribution as that of the light-emitting elements S on the first substrate 1. That is, the light-emitting elements S constituting the first element groups G1 and the second element groups G2 have the distribution where the emission characteristics are changed radially from the one end corner in the plane of each of the adjacently provided transfer areas (arrangement areas).

Besides, the second element group G2 is such that the arrangement state of the light-emitting elements S in the first element group G1 is rotated in the plane. Further, the light-emitting elements S constituting the first element group G1 and the light-emitting elements S constituting the second element group G2 are arranged in the nesting shape. Besides, the light-emitting elements of the first element group G1 and the light-emitting elements of the second element group G2 arranged in each of the transfer areas are the elements arranged on the first substrate 1 at almost the symmetrical positions with respect to the center.

By this, according to the third embodiment, the light-emitting elements S arranged on the first substrate 1 in the distribution where the emission characteristics are changed radially from the one end corner can be rearranged on the second substrate 2 so as to cancel the emission characteristics distribution while the collective transfer to simultaneously transfer the plural elements is applied. That is, the light-emitting elements S adjacent to each other on the second substrate 2 are the light-emitting elements S arranged on the first substrate 1 at almost the symmetrical positions with respect to the center. Thus, the distribution where the emission characteristics are changed radially from the one end corner on the first substrate 1 is cancelled between the light-emitting elements S adjacent to each other on the second substrate 2. Accordingly, similarly to the first embodiment, the original color unevenness (color difference in the whole display device) can be seemingly reduced. Besides, when the number of light-emitting elements S on the first substrate 1 is large, the light-emitting elements are mounted onto the second substrate in the state where the light-emitting elements S having characteristics at both sides of a characteristic average value of all the light-emitting elements S are adjacent to each other.

Besides, the arrangement interval of the arrangement of the light-emitting elements S on the first substrate 1 is enlarged from the specified initial pitches px1 and py1 to the intervals px2 and py2, and the rearrangement can be performed at the enlarged intervals.

As a result, similarly to the first embodiment and the second embodiment, the display device having excellent display quality can be obtained in which while the throughput is kept by applying the collective transfer, the distribution of the emission characteristics in the initial element arrangement is diffused, and visual recognition of color unevenness is prevented.

Figure 3D:
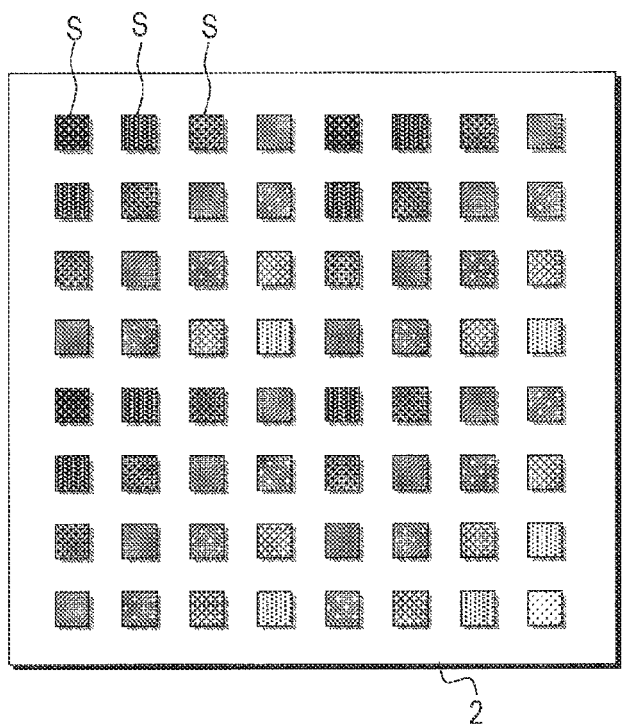
FIG. 3D is a plan view of a second substrate on which light-emitting elements are rearranged by a general procedure.

Incidentally, for comparison, in FIG. 3D, a state where light-emitting elements S are mounted onto the second substrate 2 by applying general collective transfer is shown by the shading representing the emission characteristics of the light-emitting elements S. Here, the general collective transfer is a method in which the light-emitting elements S on the first substrate 1 arranged at every other element in the row and the column directions are collectively transferred to the respective areas obtained by dividing the second substrate 2 into four in the row and the column directions. As shown in FIG. 3D, it is understood that according to the general collective transfer, in the four divided areas on the second substrate 2, the state remains in which the light-emitting elements S are arranged in the distribution where the emission characteristics are changed radially from the one end corner.

Fourth Embodiment

FIG. 4A to FIG. 4D are step views showing feature parts of a manufacturing method of a display device according to a fourth embodiment of the invention. Hereinafter, similarly to the first embodiment, a method of mounting light-emitting elements from a first substrate onto a second substrate in manufacture of the display device will be described with reference to these drawings.

Figure 4A:
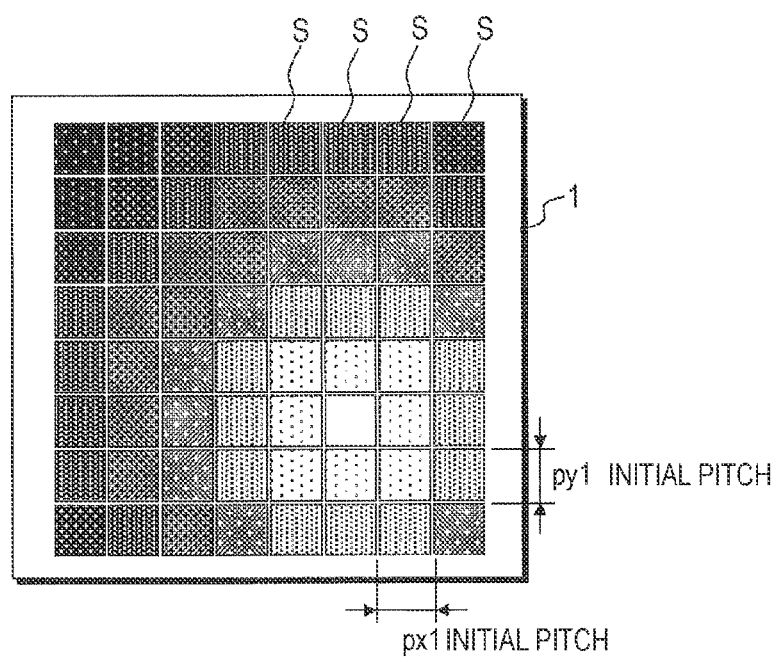
FIG. 4A is a plan view showing the emission characteristics distribution of light-emitting elements to which a fourth embodiment is applied.

First, as shown in FIG. 4A, an in-plane distribution of emission characteristics (here, emission wavelength), such as chromaticity of emitted light or brightness, is detected with respect to plural light-emitting elements S arranged on a first substrate 1 at specified initial pitches px1 and py1.

By this, as indicated by the shading representing the characteristics of the respective light-emitting elements S, it is detected that the light-emitting elements S are arranged on the first substrate 1 in the distribution where the emission characteristics are radially changed to the outside from the center deviated to the direction of one end corner. In this cases, the method of the second embodiment and the method of the third embodiment are combined, and the light-emitting elements S on the first substrate 1 are mounted as described below.

Figure 4B:
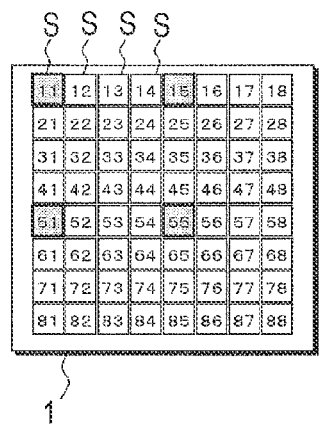
FIG. 4B is a plan view (No. 1) for explaining rearrangement in which the fourth embodiment is applied.
Figure 4B:
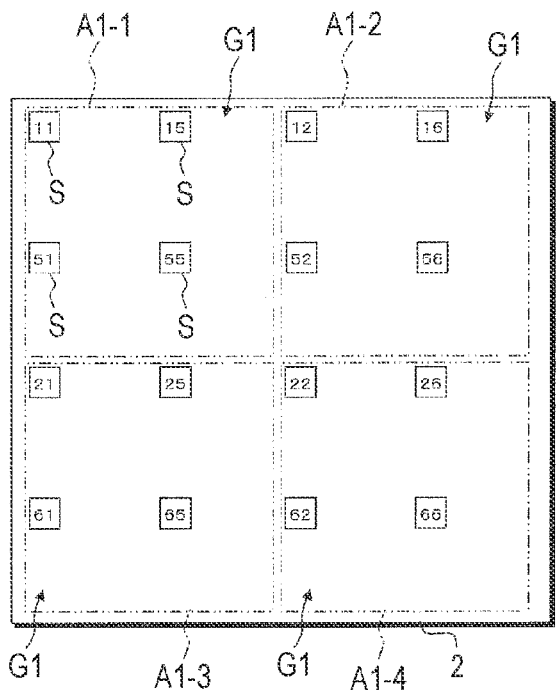
Figure 4B:
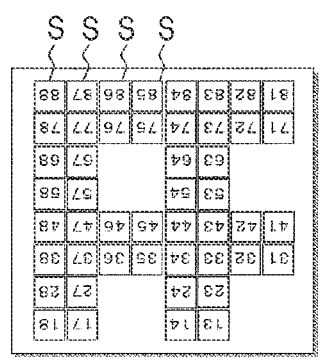
Figure 4B:
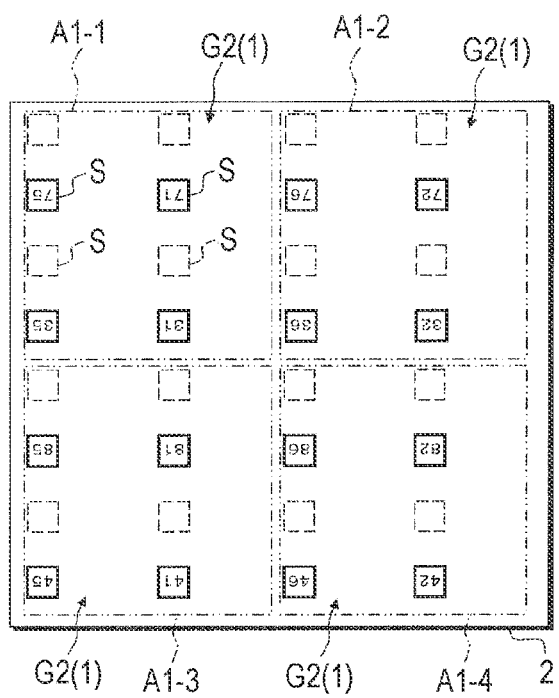

First, although a first step shown in (1) in FIG. 4B is performed almost similarly to the first embodiment, the number of light-emitting elements S collectively transferred onto a second substrate 2 is different from that in the first step of the first embodiment. That is, only four light-emitting elements S arranged at every three elements in the row and the column directions on the first substrate 1 are collectively transferred and mounted to first transfer areas A1-1 to A1-4 set on the second substrate 2.

For example, first, the first substrate 1 is arranged to be opposite to the first transfer area A1-1. Then, laser light is selectively irradiated to light-emitting elements S11, S15, S51 and S55 arranged at every three elements in the row and the column directions on the first substrate 1. By this, the four light-emitting elements S11, S15, . . . are collectively transferred and mounted to the first transfer area A1-1 of the second substrate 2.

Similarly, the first substrate 1 is moved also to the first transfer areas A1-2 to A1-4, and four light-emitting elements S are collectively transferred and mounted.

By the above, in the first step, ¼ of the light-emitting elements S arranged on the first substrate 1 are mounted onto the second substrate 2.

Incidentally, the first transfer areas A1-1 to A1-4 respectively have the same size as the area of the first substrate 1, and are set on the second substrate 2 in the state where they are adjacent to each other, and this is the same as the first embodiment. Besides, positioning is performed so that the arrangements of the respective light-emitting elements S mounted to the four first transfer areas A1-1 to A1-4 are aligned in the row direction and the column direction, and the collective transfer to the four first transfer areas A1-1 to A1-4 may be formed in any order, and this is also the same as the first embodiment.

By the collective transfer in the first step, first element groups G1 in which the light-emitting elements S are arranged in the same emission characteristics distribution as that on the first substrate 1 are mounted into the first transfer areas A1-1 to A1-4 on the second substrate 2.

Next, a first sequence of a second step shown in (2) in FIG. 4B is performed similarly to the second step of the third embodiment. That is, in the state where the first substrate 1 is rotated by 180° in a plane of each of the first transfer areas A1-1 to A1-4, the light-emitting elements S on the first substrate are collectively transferred and mounted to between the light-emitting elements S (indicated by broken lines in the drawing) on the second substrate 2.

For example, the first substrate 1 rotated by 180° is arranged to be opposite to the first transfer area A1-1. Then, the first substrate 1 is positioned on the second substrate 2 so that four light-emitting elements S31, S35, S71 and S75 arranged in the same plural columns as the light-emitting elements S mounted in the first step are arranged in the column direction between the light-emitting elements S mounted to the first transfer area A1-1 of the second substrate 2. In this state, laser light is selectively irradiated to the four light-emitting elements S31, S35, . . . and the elements are collectively transferred and mounted onto the second substrate 2.

The collective transfer as stated above is similarly performed for the other first transfer areas A1-2 to A1-4. By this, ⅓ of the light-emitting elements S remaining on the first substrate 1 after the first step are mounted onto the second substrate 2.

By the collective transfer in the first sequence of the second step, second element groups (first groups) G2(1) in which the arrangement state of the light-emitting elements S in the first element groups G1 is rotated in the plane are mounted into the respective first transfer areas A1-1 to A1-4 on the second substrate 2.

Figure 4C:
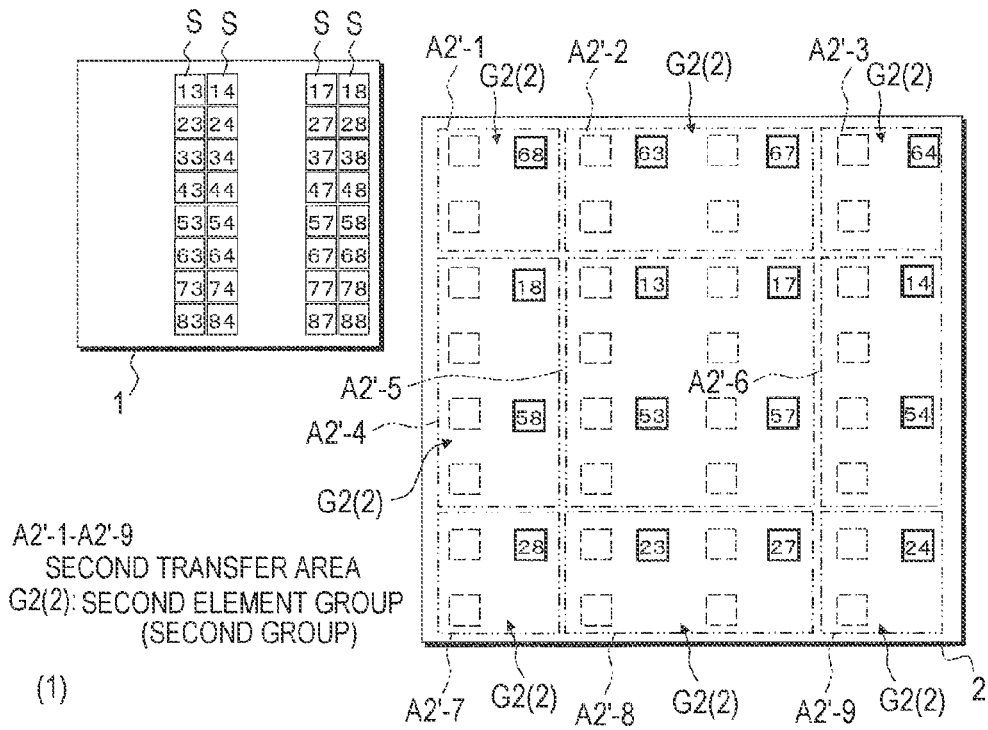
FIG. 4C is a plan view (No. 2) for explaining the rearrangement in which the fourth embodiment is applied.
Figure 4C:
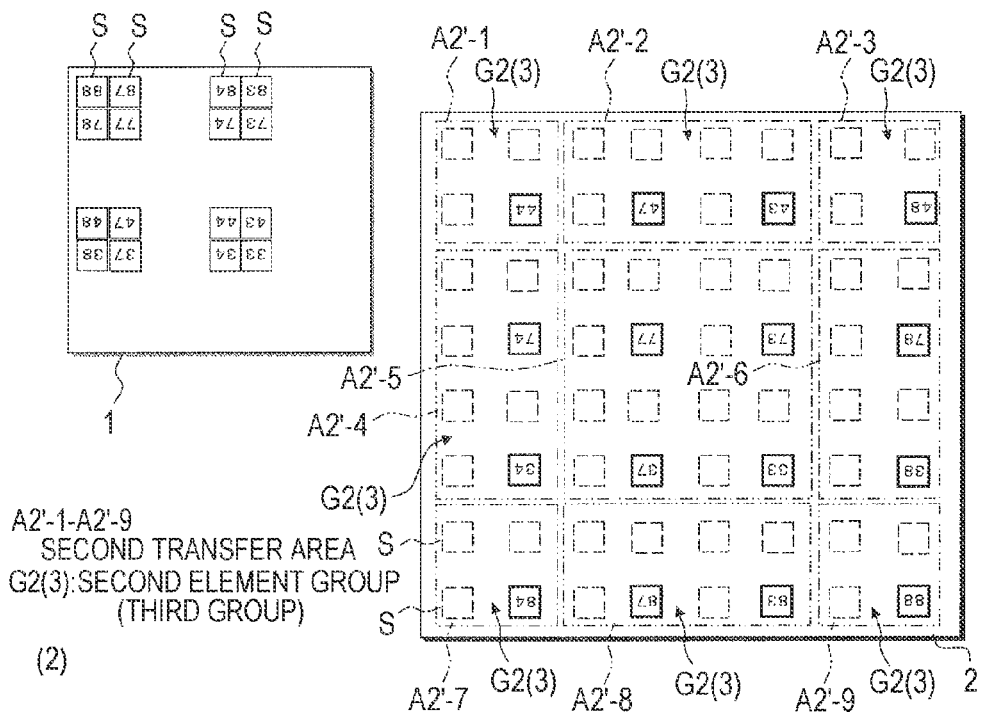

Next, a second sequence of the second step shown in (1) in FIG. 4C is performed similarly to the second step of the second embodiment. That is, first, new second transfer areas A2'-1 to A2'-9 are set on the second substrate 2 at positions shifted, with respect to the previously set first transfer areas A1-1 to A1-4, by half the size in the longitudinal direction and the lateral direction, that is, in the row direction and the column direction of the arrangement of the light-emitting elements S.

Then, the rotation state of the first substrate 1 relative to the second substrate 2 is returned to the same state as the first step by rotation of 180°, and the light-emitting elements S are successively collectively transferred.

At this time, for example, the first substrate 1 is arranged to be opposite to the center second transfer area A2'-5. Then, the first substrate 1 is positioned on the second substrate so that the four light-emitting elements S13, S17, S53 and S57 arranged on the first substrate 1 in the same plural rows as the light-emitting elements S mounted in the first step are arranged in the row direction between the light-emitting elements S mounted on the second substrate 2. In this state, laser light is selectively irradiated to the four light-emitting elements S13, S17, . . . and they are collectively transferred and mounted onto the second substrate 2.

Hereinafter, the first substrate 1 is moved to the respective second transfer areas A2'-1 to A2'-4, and A2'-6 to A2'-9, and two or one light-emitting element S arranged at position on the first substrate 1 overlapping with these is collectively transferred and mounted onto the second substrate 2. By this, ⅓ of the light-emitting elements S remaining on the first substrate 1 after the first step are mounted onto the second substrate 2.

By the collective transfer in the second sequence of the second step, second element groups (second groups) G2(2) in which the light-emitting elements S are arranged in the same emission characteristics distribution as the first element groups G1 are mounted into the respective second transfer areas A2'-1 to A2'-9 on the second substrate 2. However, among the second element groups (second groups) G2(2), those at the periphery of the second substrate 2 have the emission characteristics distribution cut along the shape of the transfer area.

Further, a third sequence of the second step shown in (2) in FIG. 4C is performed similarly to the second step of the third embodiment. That is, the first substrate 1 is rotated by 180° relative to the second transfer areas A2'-1 to A2'-9, and the light-emitting elements S on the first substrate 1 are collectively transferred and mounted to between the light-emitting elements S (indicated by broken lines in the drawing) on the second substrate 2.

For example, the first substrate 1 rotated by 180° is arranged to be opposite to the center second transfer area A2'-5. Then, the first substrate 1 is positioned on the second substrate 2 so that the four light-emitting elements S33, S37, S73 and S77 arranged on the first substrate 1 in the same plural columns as the light-emitting elements S mounted in the second sequence are arranged between the light-emitting elements S mounted in the second transfer area A2'-5 of the second substrate 2. In this state, laser light is selectively irradiated to the four light-emitting elements S33, S37, . . . and they are collectively transferred and mounted onto the second substrate 2.

The collective transfer as described above is similarly performed for the respective second transfer areas A2'-1 to S2'-4 and A2'-6 to A2'-9. By this, ⅓ of the light-emitting elements S remaining on the first substrate 1 after the first step are mounted onto the second substrate 2, and all the light-emitting elements S are mounted onto the second substrate 2.

By the collective transfer in the third sequence of the second step, second element groups (third groups) G2(3) in which the light-emitting elements S are arranged in the same emission characteristics distribution as the first element groups G1 are mounted into the respective second transfer areas A2'-1 to A2'-9 on the second substrate 2. However, among the second element groups (third groups) G2(3), those at the periphery of the second substrate 2 have the emission characteristics distribution cut along the shape of the transfer area.

The mounting of the light-emitting elements S by the collective transfer in the second step is performed in the state where the first substrate 1 is positioned relative to the second substrate 2 so that the respective light-emitting elements S are uniformly arranged at the center between the light-emitting elements S already mounted on the second substrate 2 in the first step.

Besides, in the collective transfer, when the combination of "column number, row number" of the light-emitting element S is assigned to each of the transfer areas on the second substrate 2, the omission or duplication of the light-emitting elements on the second substrate 2 can be prevented.

For example, with respect to "column number, row number" of the light-emitting elements S, an "odd number, odd number" element group, an "odd number, even number" element group, an "even number, odd number" element group, and an "even number, even number" element group are respectively assigned to the respective first transfer areas A1-1 to A1-4 shown in FIG. 4B and are collectively transferred. More specifically, the "odd number, odd number" element group is assigned to the first transfer area A1-1, the "odd number, even number" element group is assigned to the first transfer area A1-2, the "even number, odd number" element group is assigned to the first transfer area A1-3, and the "even number, even number" element group is assigned to first transfer area A1-4.

Besides, the combinations of the "column number, row number" assigned to the first transfer areas A1-1 to A1-4 are directly shifted and assigned to the respective second transfer areas A2'-1 to A2'-9 shown in FIG. 4C. More specifically, the "odd number, odd number" element group is assigned to the second transfer area A2'-5 where the first transfer area A1-1 is shifted, the "odd number, even number" element group is assigned to the second transfer areas A2'-6 and A2'-4 where the first transfer area A1-2 is shifted, and hereinafter, the assignment is similarly made.

Further, the first to the third sequence, and the collective transfers in the respective sequences may be performed in any order.

By the above, the 64 light-emitting elements S11 to S88 arranged on the first substrate 1 in 8 rows×8 columns at the initial pitches px1 and py1 are rearranged on the second substrate 2 in 8 rows×8 columns at the enlarged pitches px2 and py2 twice as large as the initial pitches px1 and py1.

Figure 4D:
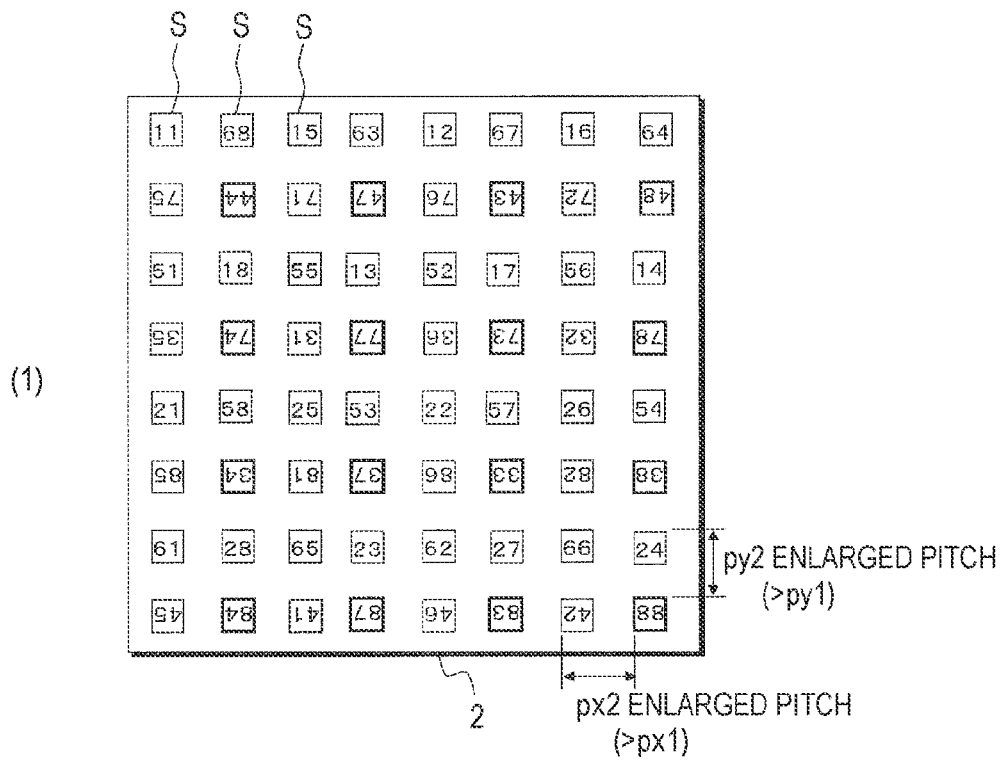
FIG. 4D is a plan view of a second substrate on which light-emitting elements are rearranged by applying the fourth embodiment.
Figure 4D:
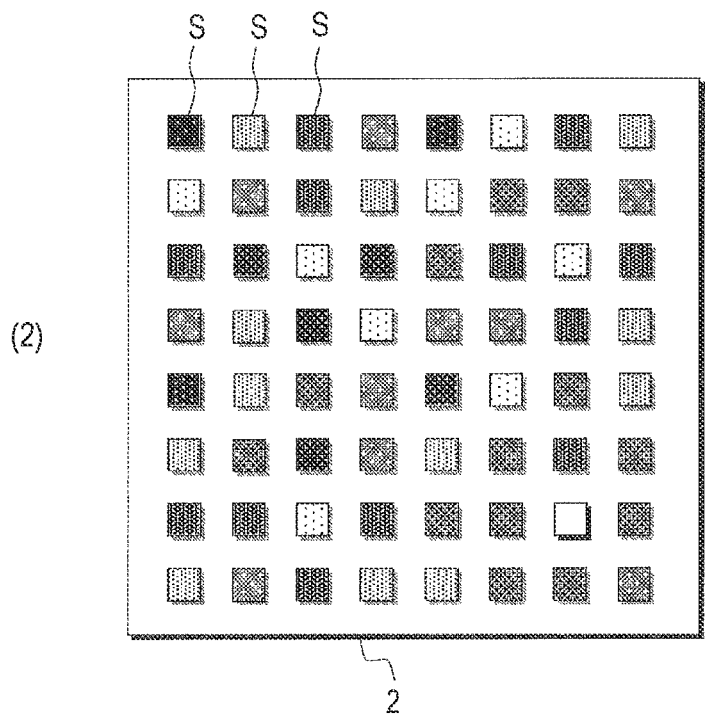

FIG. 4D shows a state where the plural light-emitting elements S are rearranged and mounted on the second substrate 2 in the manner as described above. (1) in FIG. 4D shows numbers given to the respective light-emitting elements S, and (2) in FIG. 4D shows the emission characteristics of the respective light-emitting elements S by shading.

The light-emitting elements S11 to S88 rearranged on the second substrate 2 are classified into the first element groups G1 mounted in the first step shown in (1) in FIG. 4B and the second element groups G2(1) to G2(3) mounted in the second step shown in (2) in FIG. 4B to (2) in FIG. 4C.

The light-emitting elements S constituting the first element groups G1 and the second element groups G2(1) to G2(3) are arranged in the same emission characteristics distribution as the light-emitting elements S on the first substrate 1. That is, the light-emitting elements S constituting the first element groups G1 and the second element groups G2(1) to G2(3) have the distribution where the emission characteristics are changed to the outside from the center deviated to the direction of one end corner in the plane of each of the adjacently provided transfer areas (arrangement areas).

Further, the light-emitting elements S constituting the first element groups G1 and the light-emitting elements S constituting the second element groups G2(1) to G2(3) are arranged in a nesting shape.

According to the fourth embodiment, the light-emitting elements S arranged on the first substrate 1 in the distribution where the emission characteristics are changed radially from the one end corner can be rearranged on the second substrate 2 so as to cancel the emission characteristics distribution while the collective transfer to simultaneously transfer the plural elements is applied. Further, when the number of light-emitting elements S on the first substrate 1 is large, the light-emitting elements are mounted on the second substrate in the state where the light-emitting elements S having characteristics at both sides of a characteristic average value of all the light-emitting elements S are adjacent to each other. Besides, the arrangement interval of the arrangement of the light-emitting elements S on the first substrate 1 is enlarged from the specified initial pitches px1 and py1 to the intervals px2 and py2, and the rearrangement can be performed at the enlarged intervals.

As a result, similarly to the first to the third embodiments, the display device having excellent display quality can be obtained in which while the throughput is kept by applying the collective transfer, the distribution of the emission characteristics in the initial element arrangement is diffused, and visual recognition of color unevenness is prevented.

Figure 4E:
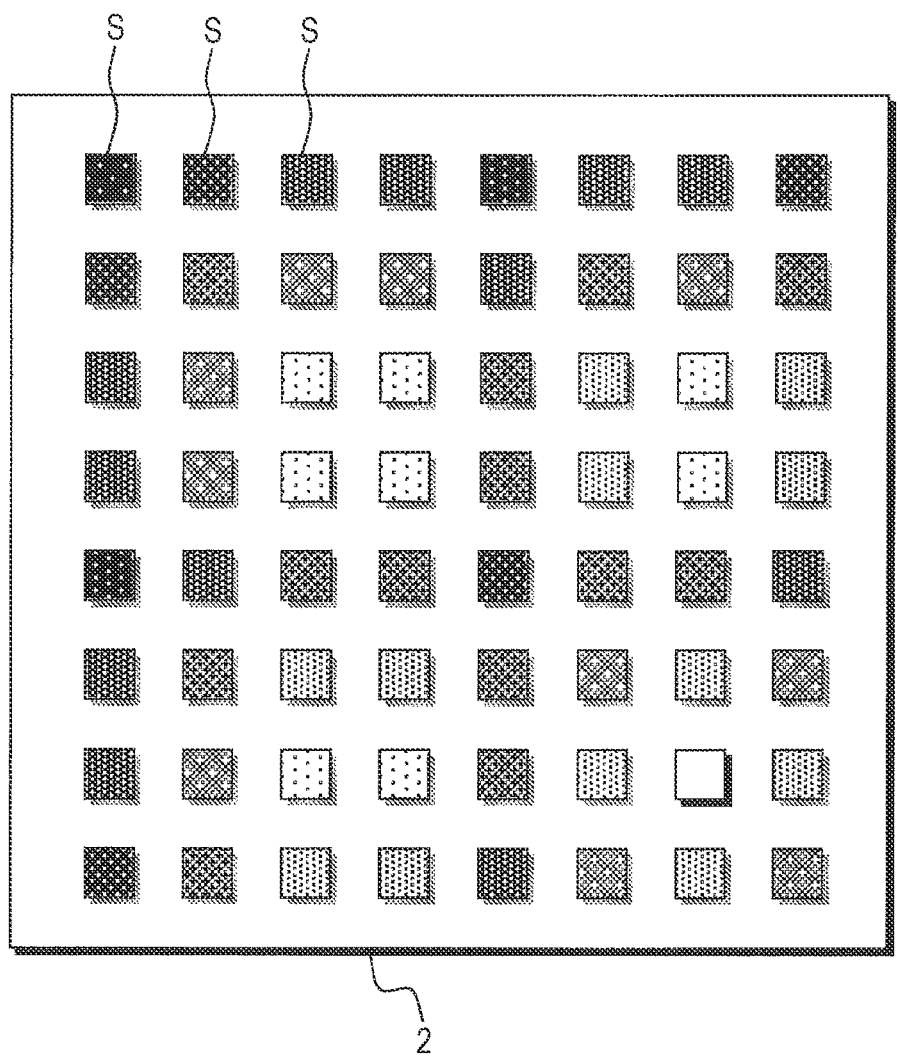
FIG. 4E is a plan view of a second substrate on which light-emitting elements are rearranged by a general procedure.

Incidentally, for comparison, in FIG. 4E, a state where light-emitting elements S are mounted onto the second substrate 2 by applying general collective transfer is shown by the shading representing the emission characteristics of the respective light-emitting elements S. Here, the general collective transfer is a method in which the light-emitting elements S on the first substrate 1 arranged at every other element in the row and the column directions are collectively transferred to the respective areas obtained by dividing the second substrate 2 into four in the row and the column directions. As shown in FIG. 4E, it is understood that according to the general collective transfer, in the four-divided areas on the second substrate 2, the state remains in which the light-emitting elements S are arranged in the distribution where the emission characteristics are changed to the outside from the center deviated to the direction of one end corner.

Fifth Embodiment

Figure 5B:
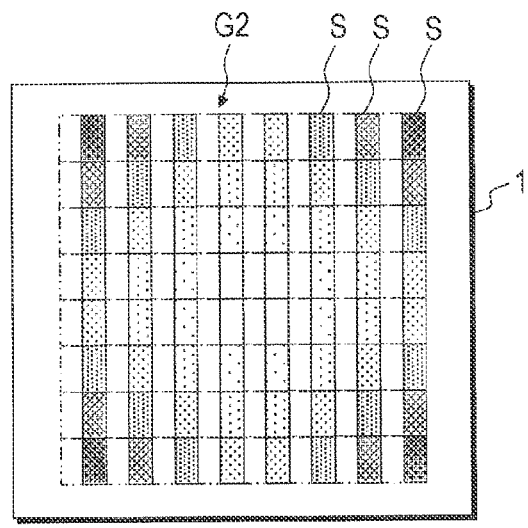
FIG. 5B is a plan view (No. 2) for explaining the rearrangement in which the fifth embodiment is applied.
Figure 5B:
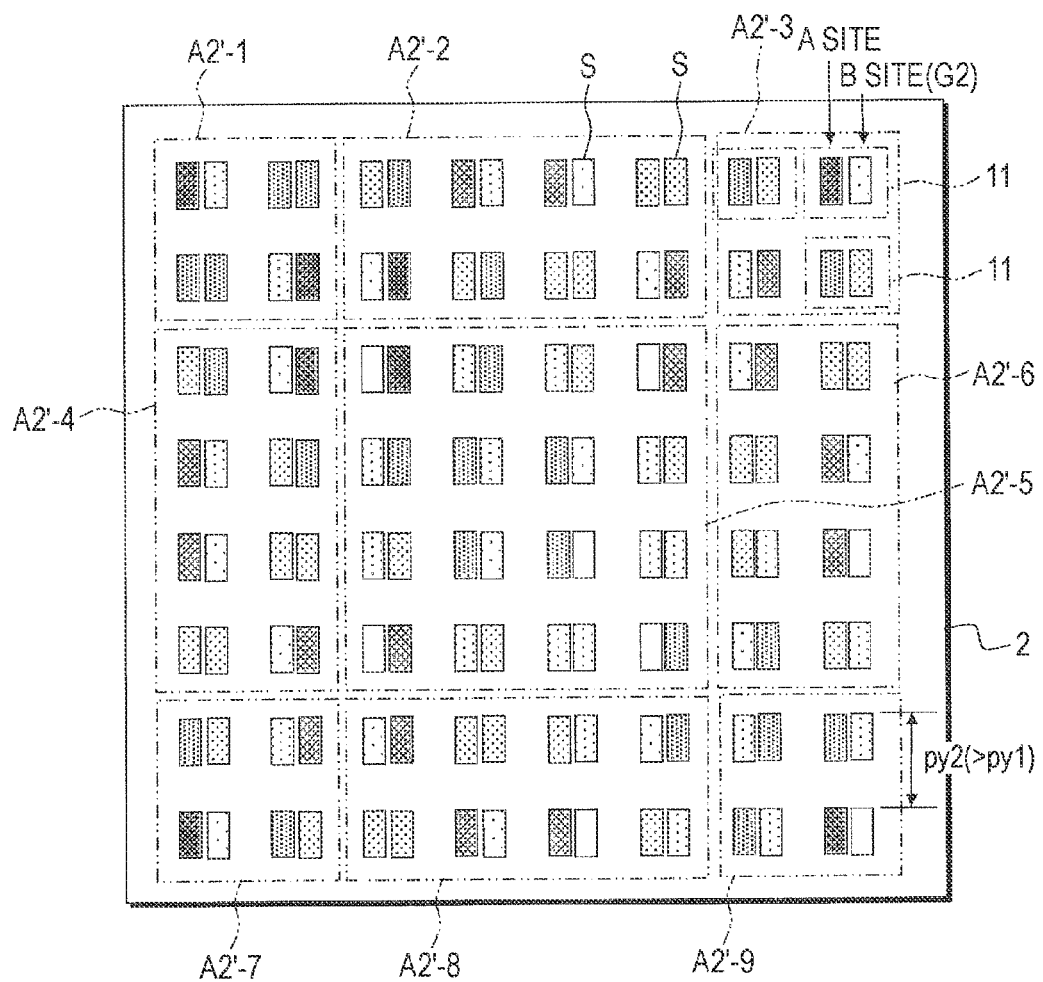

FIG. 5A and FIG. 5B are step views showing feature parts of a manufacturing method of a display device according to a firth embodiment of the invention. The fifth embodiment is a modified example of the first embodiment and the second embodiment, and an example in which two light-emitting elements constitute one pixel. Hereinafter, similarly to the first embodiment, a method of mounting light-emitting elements from a first substrate onto a second substrate in manufacture of the display device will be described with reference to the drawings.

First, as shown in FIG. 5A, an in-plane distribution of emission characteristics (here, emission wavelength), such as chromaticity of emitted light or brightness, is detected with respect to plural light-emitting elements S arranged on a first substrate 1 at specified initial pitches px1 and py1. It is assumed that by this, similarly to the second embodiment, it is detected that the light-emitting elements S are arranged in the distribution where the emission characteristics are changed radially from the center to the outside in a plane.

Also in this case, first, a first step is performed similarly to the first embodiment (second embodiment). That is, first transfer areas A1-1 to A1-4 are set on the second substrate 2 onto which the light-emitting elements S are mounted from the first substrate 1. Then, among the light-emitting elements S arranged on the first substrate 1, light-emitting elements S arranged at every specified number of elements are collectively transferred to the respective first transfer areas A1-1 to A1-4. By this, first element groups G1 in which the light-emitting elements S are arranged in the same emission characteristics distribution as that on the first substrate 1 are mounted into the respective first transfer areas A1-1 to A1-4 on the second substrate 2.

However, here, it is assumed that in all the first areas A1-1 to A1-4, plural pixels 11 each including two light-emitting elements S are arranged in the row and the column directions. Then, the light-emitting elements S are collectively transferred to only one site (for example, A site) of two sites obtained by halving one pixel 11 in, for example, the row direction. Accordingly, in the first areas A1-1 to A1-4, the light-emitting elements S are transferred to only the A sites in the same square lattice shape, not a check pattern, as the pixel pitch. For example, in the illustrated example, the light-emitting elements S arranged at every three elements in the row direction and arranged at every other element in the column direction are successively collectively transferred into the first areas A1-1 to A1-4.

Thereafter, in a second step shown in FIG. 5B, new transfer areas (second transfer areas) A2'-1 to A2'-9 are set on the second substrate 2. The second transfer areas A2'-1 to A2'-9 are similar to the second embodiment, and are set at positions shifted, with respect to the first transfer areas (A1-1 to A1-4) set in the first step, by half the size in the longitudinal direction and the lateral direction, that is, in the row direction and the column direction of the arrangement of the light-emitting elements S.

The first substrate 1 is arranged to be opposite to the respective second transfer areas A2'-1 to A2'-9 on the second substrate 2 set as described above, and the light-emitting elements S remaining on the first substrate 1 are successively collectively transferred. At this time, in all the second transfer areas A2'-1 to A2'-9, the light-emitting elements S are collectively transferred to only the other site (for example, B site) of the two sites obtained by halving the one pixel 11 in the row direction.

By this, the light-emitting elements S are mounted to the second transfer areas A2'-1 to A2'-9 of the second substrate 2 so that two light-emitting elements S are arranged in the one pixel 11. Incidentally, a difference between mount positions of the plural light-emitting elements S constituting the one pixel 11 is sufficiently smaller than the arrangement period of the pixel 11 (for example, ⅓ or less). Besides, the plural light-emitting elements S constituting the one pixel 11 are connected in series or in parallel to a drive circuit and are driven by the same signal (current in the case of series, and voltage in the case of parallel).

By the above, the 128 light-emitting elements S arranged on the first substrate in 16 rows×8 columns at the initial pitches px1 and py1 are rearranged on the second substrate 2 in 16 rows×8 columns at a pitch obtained by enlarging the initial pitch px1 in accordance with the specified pixel pitch and at an enlarged pitch py2 twice as larger as the initial pitch py1.

The light-emitting elements S rearranged on the second substrate 2 as described above are classified into the first element groups G1 mounted in the first step shown in FIG. 5A and the second element groups G2 mounted in the second step shown in FIG. 5B. The light-emitting elements S constituting the first element groups G1 and the second element groups G2 are the same as those of the second embodiment, and are arranged in the same emission characteristics distribution as the light-emitting elements S on the first substrate 1.

Thus, the light-emitting elements S arranged on the first substrate 1 in the distribution where the emission characteristics are changed radially from the center to the outside are rearranged so that the emission characteristics distribution is cancelled and the original color unevenness is seemingly reduced to ½ or less. Especially, in the fifth embodiment, since the one pixel 11 includes the adjacently transferred plural (here, two) light-emitting elements S, the emission characteristics in the one pixel 11 can be averaged to approach the average value of the whole second substrate 2.

Sixth Embodiment

Figure 6A:
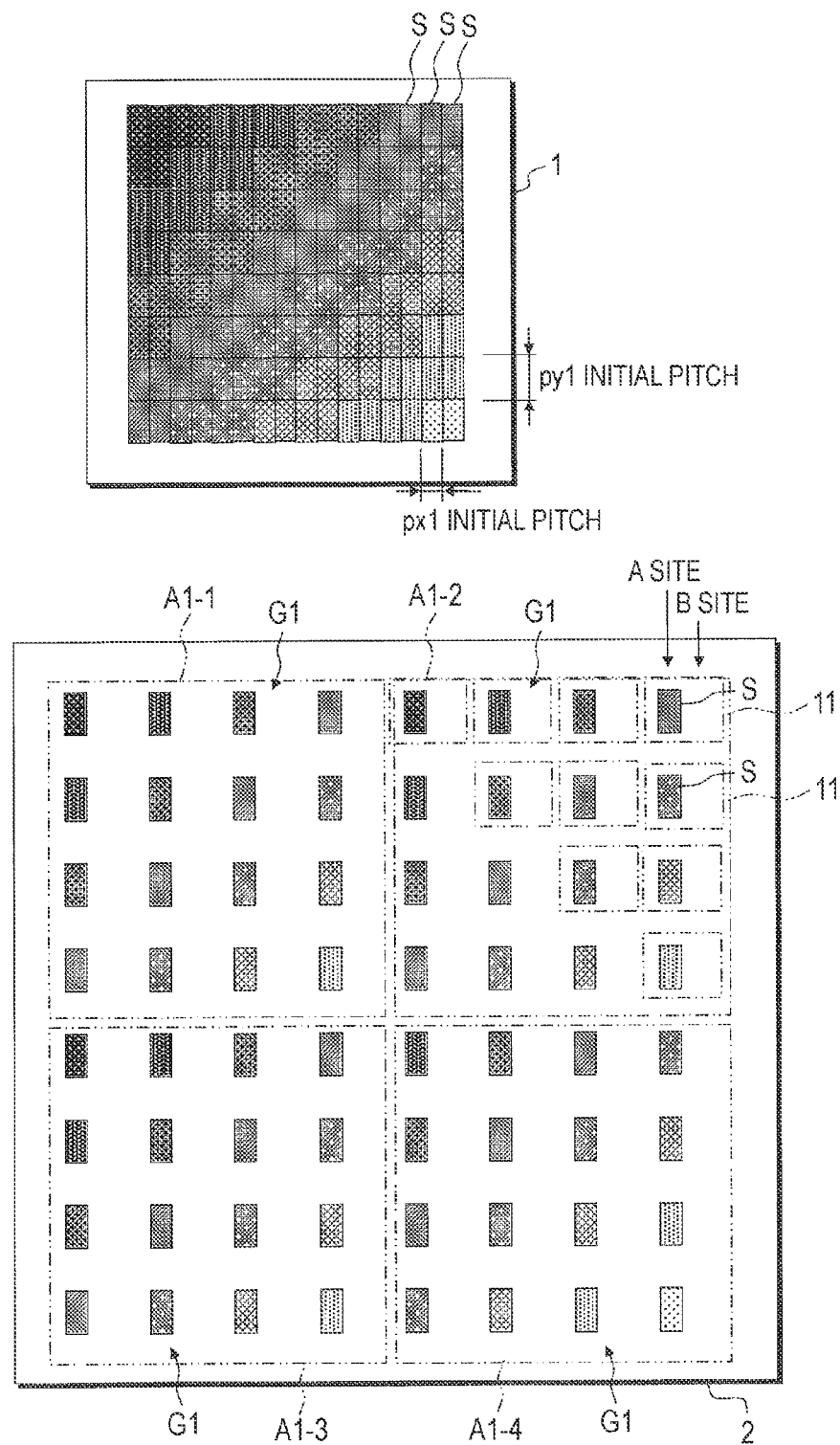
FIG. 6A is a plan view (No. 1) for explaining rearrangement in which a sixth embodiment is applied.
Figure 6B:
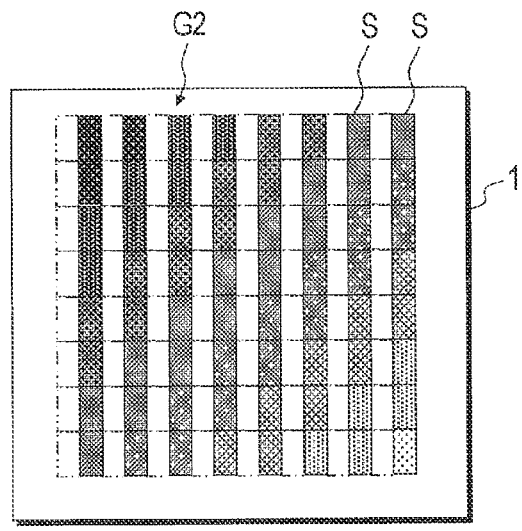
FIG. 6B is a plan view (No. 2) for explaining the rearrangement in which the sixth embodiment is applied.
Figure 6B:
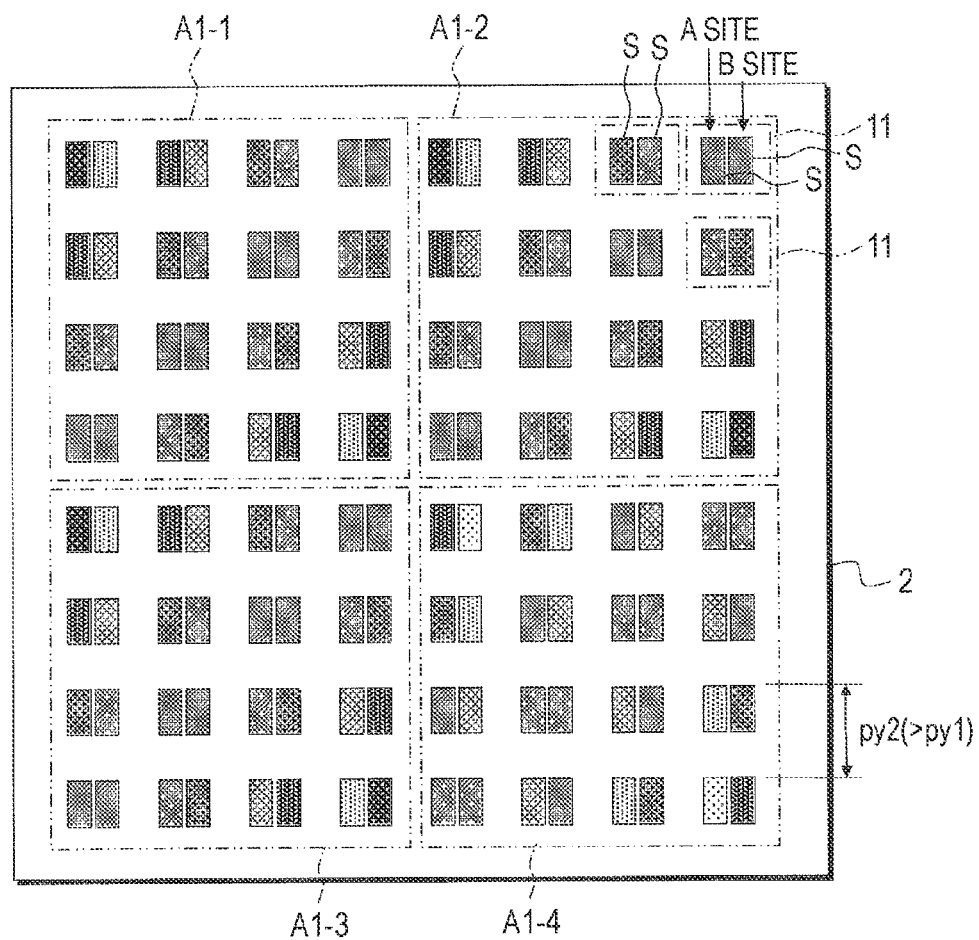

FIG. 6A and FIG. 6B are step views showing feature parts of a manufacturing method of a display device according to a sixth embodiment of the invention. The sixth embodiment is a modified example of the third embodiment, and is an example in which two light-emitting elements constitute one pixel. Hereinafter, similarly to the first embodiment, a method of mounting light-emitting elements from a first substrate onto a second substrate in manufacture of the display device will be described with reference to these drawings.

First, as shown in FIG. 6A, an in-plane distribution of emission characteristics (here, emission wavelength), such as chromaticity of emitted light or brightness, is detected with respect to plural light-emitting elements S arranged on a first substrate 1 at specified initial pitches px1 and py1. It is assumed that by this, similarly to the third embodiment, it is detected that the light-emitting elements S are arranged on the first substrate 1 in the distribution where the emission characteristics are radially monotonously changed in one direction from one end corner in a plane.

Also in this case, first, in a first step, first transfer areas A1-1 to A1-4 are set on the second substrate 2 onto which the light-emitting elements S are mounted from the first substrate 1, and the light-emitting elements S are transferred to only A sites in the first areas A1-1 to A1-4 in the same square lattice shape as the pixel pitch. This is the same as the fifth embodiment.

Thereafter, in a second step shown in FIG. 6B, the first substrate 1 is rotated by 180° in a plane with respect to the respective first transfer areas A1-1 to A1-4 set in the first step. Then, the light-emitting elements S are successively collectively transferred to the respective first transfer areas A1-1 to A1-4 on the second substrate 2.

At this time, in all the first areas A1-1 to A1-4, the light-emitting elements S are collectively transferred to only the other site (for example, B site) of two sites obtained by halving the one pixel 11 in the row direction.

By this, the light-emitting elements S are mounted to the respective first transfer areas A1-1 to A1-4 of the second substrate 2 so that two light-emitting elements S are arranged in the one pixel 11. Incidentally, a difference between mount positions of the plural light-emitting elements S constituting the one pixel 11 is sufficiently smaller than the arrangement period of the pixel 11, and the plural light-emitting elements S constituting the one pixel 11 are driven by the same signal, and this is the same as the fifth embodiment.

By the above, the 128 light-emitting elements S arranged on the first substrate in 16 rows×8 columns at the initial pitches px1 and py1 are rearranged on the second substrate 2 in 16 rows×8 columns at a pitch obtained by enlarging the initial pitch px1 in accordance with the specified pixel pitch and at an enlarged pitch py2 twice as larger as the initial pitch py1.

The light-emitting elements S rearranged on the second substrate 2 as described above are classified into the first element groups G1 mounted in the first step shown in FIG. 6A and the second element groups G2 mounted in the second step shown in FIG. 6B. The light-emitting elements S constituting the first element groups G1 and the second element groups G2 are the same as those of the third embodiment, and are arranged in the same emission characteristics distribution as the light-emitting elements S on the first substrate 1.

Thus, the light-emitting elements S arranged on the first substrate 1 in the distribution where the emission characteristics are changed radially from the one end corner in the plane are rearranged so that the emission characteristics distribution is cancelled and the original color unevenness is seemingly reduced to ½ or less. Especially, in the sixth embodiment, since the one pixel 11 includes the adjacently transferred plural (here, two) light-emitting elements S, the emission characteristics in the one pixel 11 can be averaged to approach the average value of the whole second substrate 2.

Seventh Embodiment

FIG. 7A to FIG. 7D are step views showing feature parts of a manufacturing method of a display device according to a seventh embodiment of the invention. The seventh embodiment is a modified example of the fourth embodiment, and is an example in which two light-emitting elements constitute one pixel. Hereinafter, similarly to the first embodiment, a method of mounting light-emitting elements from a first substrate onto a second substrate in manufacture of the display device will be described with reference to these drawings.

Figure 7A:
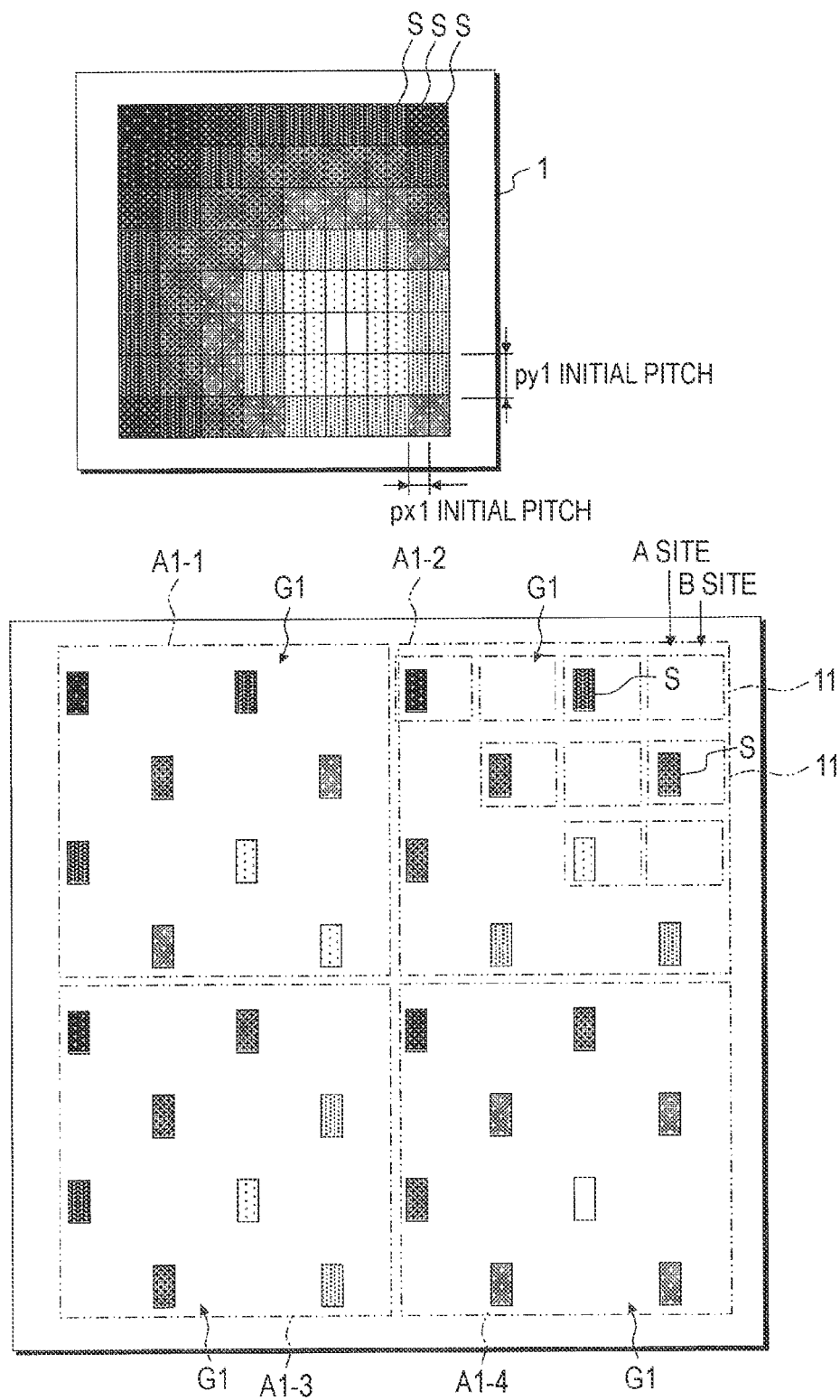
FIG. 7A is a plan view (No. 1) for explaining rearrangement in which a seventh embodiment is applied.

First, as shown in FIG. 7A, an in-plane distribution of emission characteristics (here, emission wavelength), such as chromaticity of emitted light or brightness, is detected with respect to plural light-emitting elements S arranged on a first substrate 1 at specified initial pitches px1 and py1. It is assumed that by this, similarly to the fourth embodiment, it is detected that the light-emitting elements S are arranged on the first substrate 1 in the distribution where the emission characteristics are radially changed to the outside from the center deviated to one end corner direction.

Also in this case, first, in a first step, first transfer areas A1-1 to A1-4 are set on the second substrate onto which the light-emitting elements S are mounted from the first substrate 1. Then, the light-emitting elements S are transferred to only A sites of pixels 11 which are arranged at every other pixel in the pixels 11 set in the first areas A1-1 to A1-4 and form a check pattern.

Figure 7B:
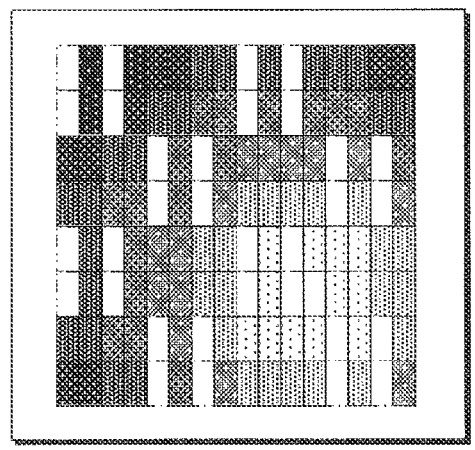
FIG. 7B is a plan view (No. 2) for explaining the rearrangement in which the seventh embodiment is applied.
Figure 7B:
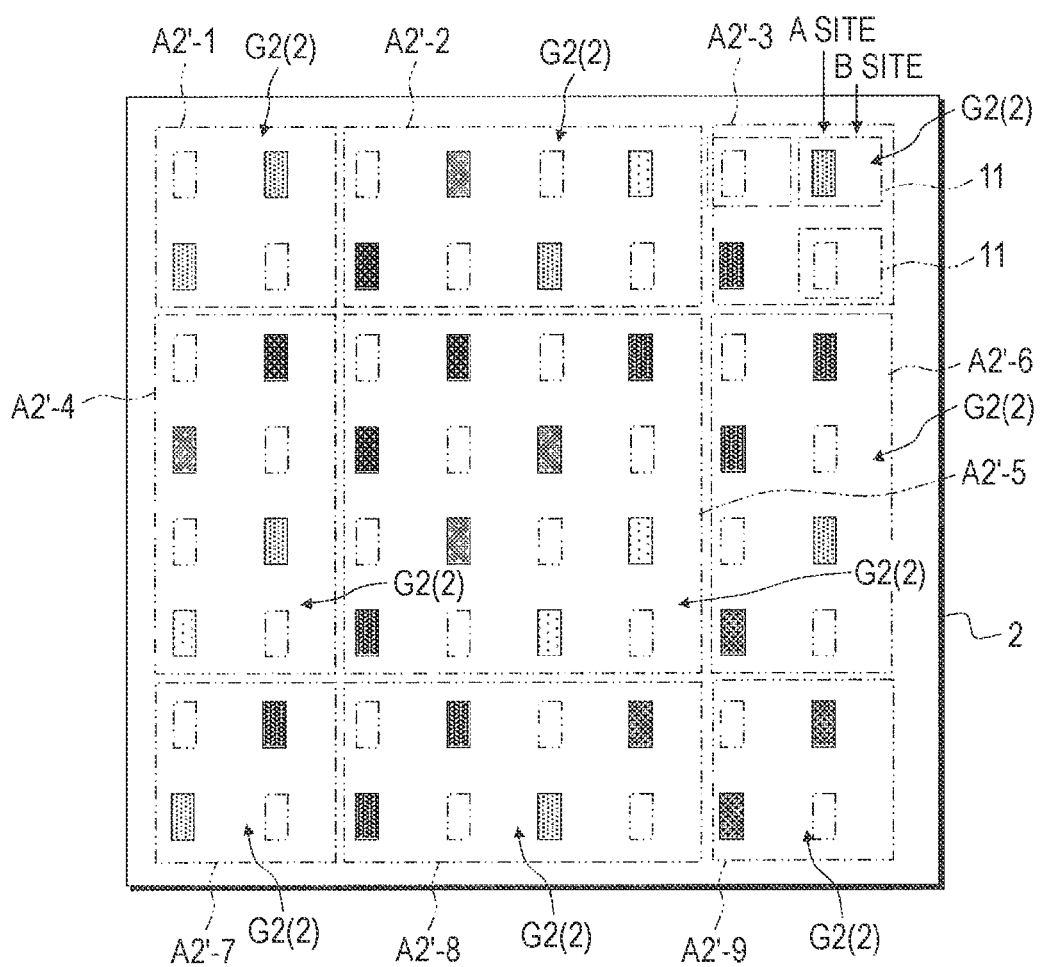

Next, in a second step shown in FIG. 7B, the first sequence and the second sequence of the second step in the fourth embodiment are exchanged and performed. First, as the second sequence, new second transfer areas A2'-1 to A2'-9 are set at positions shifted, with respect to the previously set first transfer areas (A1-1 to A1-4), by half the size in the row direction and the column direction of the arrangement of the light-emitting elements S. Then, the first substrate 1 is arranged to be opposite to the respective second transfer areas A2'-1 to A2'-9, and the light-emitting elements S remaining on the first substrate 1 are successively transferred. At this time, in all the second transfer areas A2'-1 to A2'-9, the light-emitting elements S are collectively transferred to only the remaining A site in the one pixel 11.

By the collective transfer in the second sequence of the second step as described above, second element groups (second groups) G2(2) in which the arrangement state of the light-emitting elements S in the first element groups G1 is shifted in a plane are mounted into the respective second transfer areas A2'-1 to A2'-9 on the second substrate 2. Incidentally, in the drawing, the light-emitting elements S of the first element groups G1 mounted by the collective transfer of the first step are indicated by two-dot chain lines.

Figure 7C:
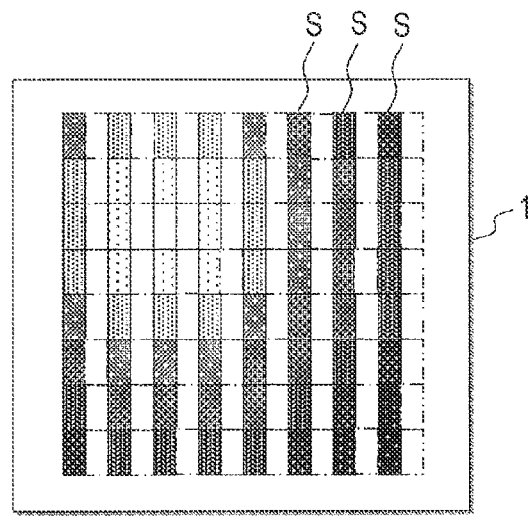
FIG. 7C is a plan view (No. 3) for explaining the rearrangement in which the seventh embodiment is applied.
Figure 7C:
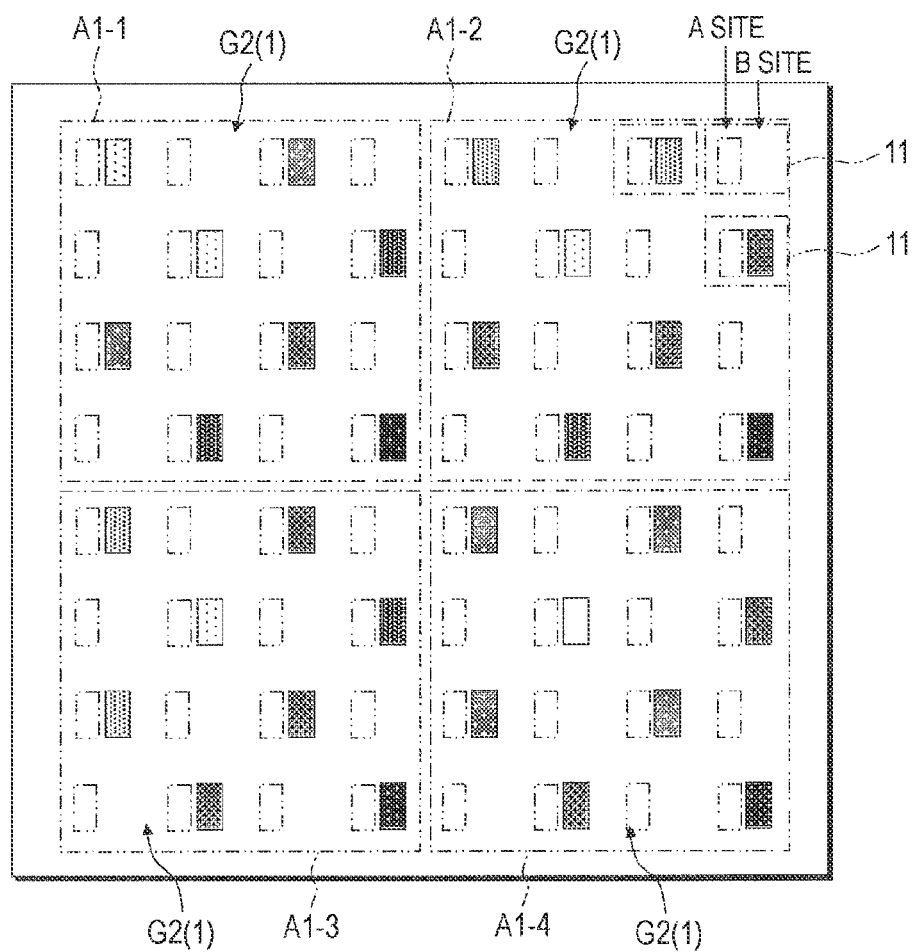

Next, as the first sequence of the second step shown in FIG. 7C, in a state where the first substrate 1 is rotated by 180° in the plane of the respective first transfer areas A1-1 to A1-4 set on the second substrate 2, the light-emitting elements S on the first substrate 1 are mounted by the collective transfer to between the light-emitting elements S (indicated by broken lines in the drawing) on the second substrate 2. At this time, the light-emitting elements S are transferred to only the B sites of the pixels 11 which are arranged at every other pixel in the pixels 11 set in the first areas A1-1 to A1-4 and form a check pattern.

Second element groups (first groups) G2(1) in which the arrangement state of the light-emitting elements S in the first element groups G1 is rotated in the plane are mounted into the respective first transfer areas A1-1 to A1-4 on the second substrate 2 by the collective transfer in the first sequence of the second step. Incidentally, in the drawings, the light-emitting elements S of the first element groups G1 mounted by the collective transfer of the first step and the light-emitting elements S of the second element groups (second groups) G2(2) mounted in the second sequence of the second step are indicated by two-dot chain lines.

Next, in a third sequence of the second step shown in FIG. 7D, in the state where the first substrate 1 is rotated by 180° in the plane of the respective second transfer areas A2'-1 to A2'-9 set on the second substrate 2, the light-emitting elements S on the first substrate 1 are mounted by the collective transfer to between the light-emitting elements S (indicated by broken lines in the drawing) on the second substrate. At this time, in all the second transfer areas A2'-1 to A2'-9, the light-emitting elements S are collectively transferred to only the remaining B site in the one pixel 11.

By the collective transfer in the third sequence of the second step as described above, second element groups (third groups) G2(3) in which the arrangement state of the light-emitting elements S in the first element groups G1 is shifted and rotated in the plane are mounted into the second transfer areas A2'-1 to A2'-9 on the second substrate 2.

By this, the light-emitting elements S are mounted onto the second substrate 2 so that the two light-emitting elements S are arranged in the one pixel 11. Incidentally, a difference between the mount positions of the plural light-emitting elements S constituting the one pixel 11 is sufficiently smaller than the arrangement period of the pixel 11, and the plural light-emitting elements S constituting the one pixel 11 are driven by the same signal, and this is the same as the fifth embodiment.

By the above, the 128 light-emitting elements S arranged on the first substrate 1 in 16 rows×8 columns at the initial pitches px1 and py1 are rearranged on the second substrate 2 in 16 rows×8 columns at a pitch obtained by enlarging the initial pitch px1 in accordance with the specified pixel pitch and at an enlarged pitch py2 twice as larger as the initial pitch py1.

The light-emitting elements S rearranged on the second substrate 2 as described above are classified into the first element groups G1 mounted in the first step shown in FIG. 7A and the second element groups G2(1) to G2(3) mounted in the first sequence to the third sequence of the second step shown in FIG. 7B to FIG. 7D. The light-emitting elements S constituting the first element groups G1 and the second element groups G2(1) to G2(3) are the same as those of the fourth embodiment, and are arranged in the same emission characteristics distribution as the light-emitting elements S on the first substrate 1.

Thus, the light-emitting elements S arranged on the first substrate 1 in the distribution where the emission characteristics are changed radially to the outside from the center deviated to the direction of one end corner in the plane are rearranged so that the emission characteristics distribution is cancelled and the original color unevenness is seemingly reduced to ½ or less. Especially, in the seventh embodiment, since the one pixel 11 includes the adjacently transferred plural (here, two) light-emitting elements S, the emission characteristics in the one pixel 11 can be averaged to approach the average value of the whole second substrate 2.

Especially, in the procedure of the foregoing sequences, the one pixel 11 includes the light-emitting elements S at the positions where the first substrate 1 is shifted. Accordingly, when the symmetry of the wavelength distribution in the first substrate 1 is high, the deviation of the average wavelength in the pixel can be effectively reduced by selecting the procedure as stated above.

Incidentally, in the second step of the seventh embodiment, the first to the third sequence and the collective transfers in the respective sequences may be performed in any order. For example, similarly to the fourth embodiment, in the first sequence of the second step, the light-emitting elements S may be collectively transferred to the remaining A sites in the pixels 11 in the state where the first substrate 1 is rotated by 180° in the plane of the respective first transfer areas A1-1 to A1-4. In the second sequence of the second step, the second transfer areas A2'-1 to A2'-9 are set in which the first transfer areas are shifted, and the light-emitting elements S are transferred to only the B sites of the pixels 11 which are arranged at every other pixel in the pixels 11 and form a check pattern. Besides, in the third sequence of the second step, the light-emitting elements S are collectively transferred to the remaining B sites in the pixels 11 in the state where the first substrate 1 is rotated by 180° in the shifted second transfer areas A2'-1 to A2'-9.

In this case, one pixel 11 is formed of the light-emitting elements S at positions where the first substrate 1 is rotated by 180°. Accordingly, when asymmetry of the wavelength distribution in the first substrate 1 is high, the deviation of the average wavelength in the pixel can be effectively reduced by selecting the procedure as stated above.

Eighth Embodiment

FIG. 8A to FIG. 8E are step views showing a manufacturing method of a display device to which the rearrangement of the first to the seventh embodiments is applied. Hereinafter, a procedure from formation of light-emitting elements on a first substrate 1 to fabrication of a display device will be described with reference to these drawings.

Figure 8A:
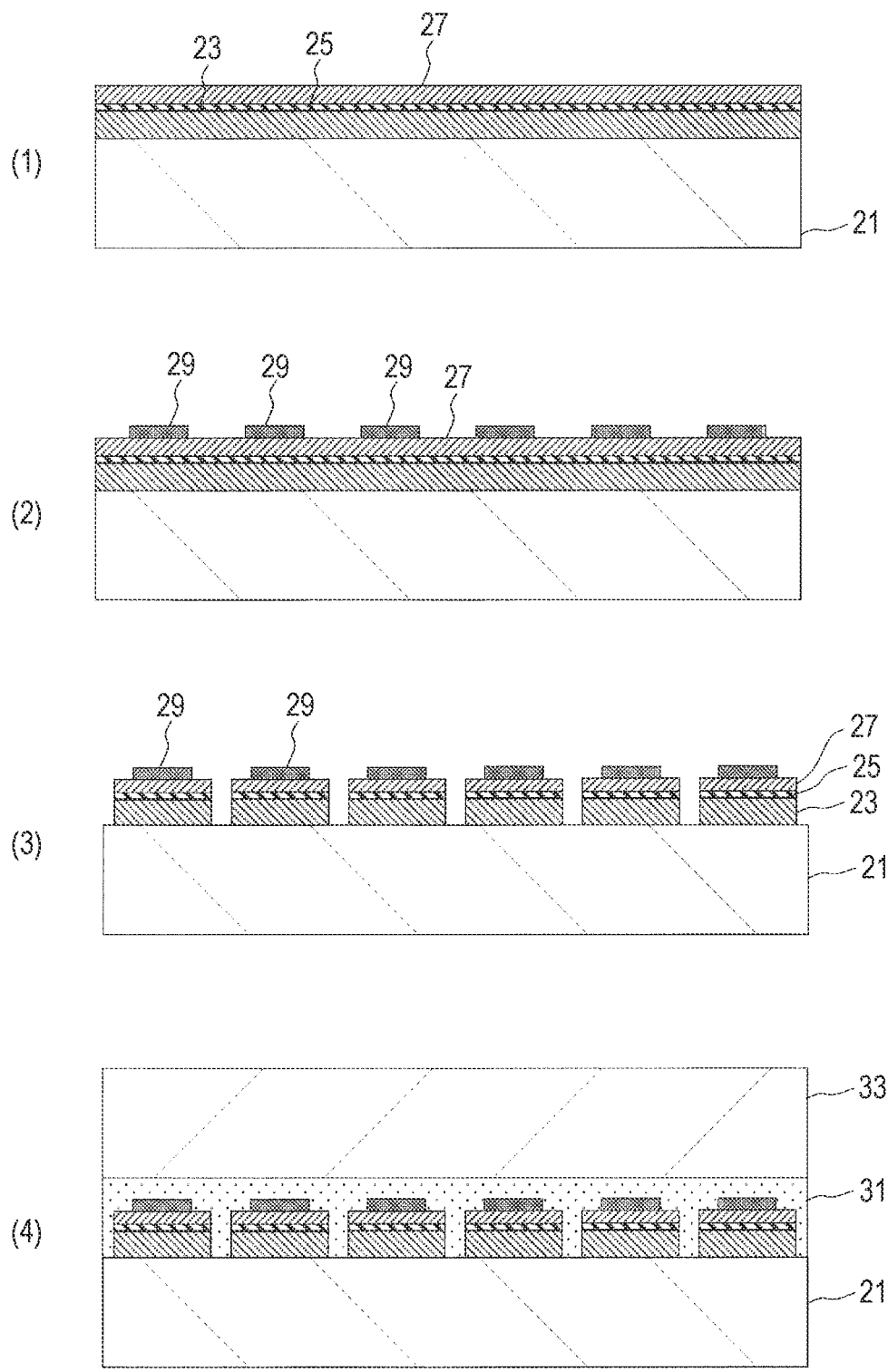
FIG. 8A is a sectional step view (No. 1) showing a manufacturing step of a display device of an eighth embodiment.

First, as shown in (1) in FIG. 8A, a growth substrate 21 for crystal growth made of sapphire or the like is prepared. An n-type clad layer 23 made of n-GaN, a light-emitting layer 25 of multiple-quantum-well structure (MQW structure) in which InGaN/GaN is laminated, and a p-type clad layer 27 made of p-GaN are successively formed on the growth substrate 21. The film formation is performed by, for example, an MOCVD method.

Next, as shown in (2) in FIG. 8A, p-type electrodes 29 are pattern-formed in respective element regions on the p-type clad layer 27. The formation of the p-type electrodes 29 is performed by evaporation film formation of an electrode film and etching of the electrode film from above a mask pattern formed by applying a lithography method.

Thereafter, as shown in (3) in FIG. 8A, the p-type clad layer 27, the light emitting layer 25, and the n-clad layer 23 are patterned for the respective element regions and element separation is performed. This element separation is performed by, for example, etching from above a mask pattern formed by applying the lithography method.

Next, as shown in (4) in FIG. 8A, a support substrate 33 is bonded to an element formation surface side of the growth substrate 21 through an adhesion layer 31. The support substrate 33 is made of, for example, resin material. Especially, in the embodiment, the support substrate 33 is used as the first substrate 1 in the first to the seventh embodiments. Thus, it is important that the support substrate 33 is made of a material transparent to laser light.

Figure 8B:
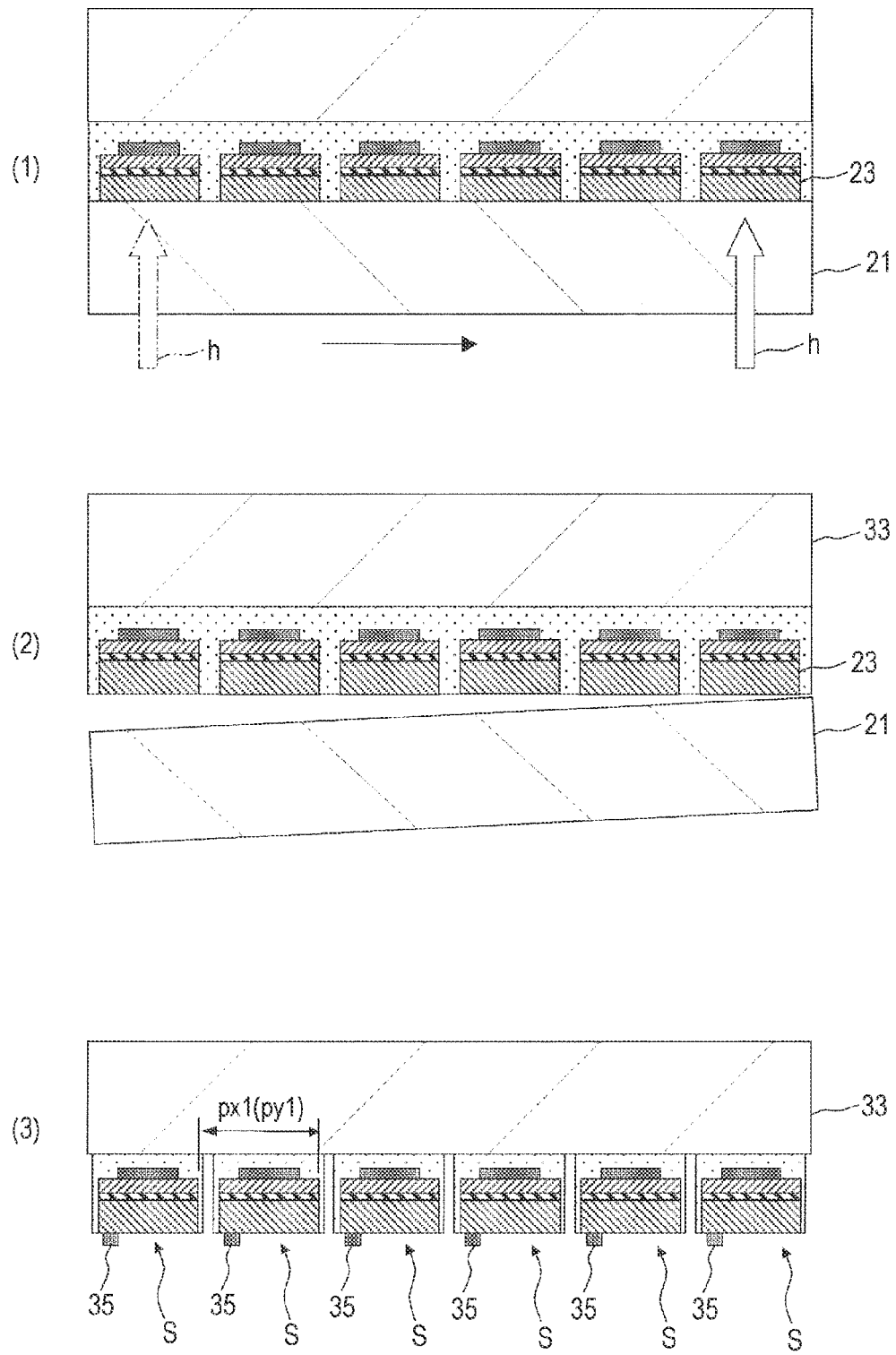
FIG. 8B is a sectional step view (No. 2) showing the manufacturing step of the display device of the eighth embodiment.

Next, as shown in (1) in FIG. 8B, laser light h is irradiated from the growth substrate 21 side to the n-clad layer 23. The laser light is an ultraviolet pulse wave.

By this, as shown in (2) in FIG. 8B, the n-clad layer 23 and the growth substrate 21 are separated, and the growth substrate 21 is peeled off while the n-clad layer 23 and the like remain on the support substrate 33 from the growth substrate 21.

Thereafter, as shown in (3) in FIG. 8B, n-type electrodes 35 are pattern-formed on the respective separated n-clad layers 23, and the adhesion layer 31 is patterned between the separated n-clad layers 23 to perform element re-separation. At this time, the formation of the n-type electrodes 35 is performed by evaporation film formation of an electrode film and etching of the electrode film from above a mask pattern formed by applying the lithography method. Besides, the element re-separation is performed by etching from above a mask pattern formed by applying, for example, the lithography method.

By the above, light-emitting elements S made of LEDs are formed and arranged on the support substrate 33 at specified initial pitches px1 and py1. In these light-emitting elements S, for example, the formation surface side of the n-type electrode 35 is a light-emitting surface.

Figure 8C:
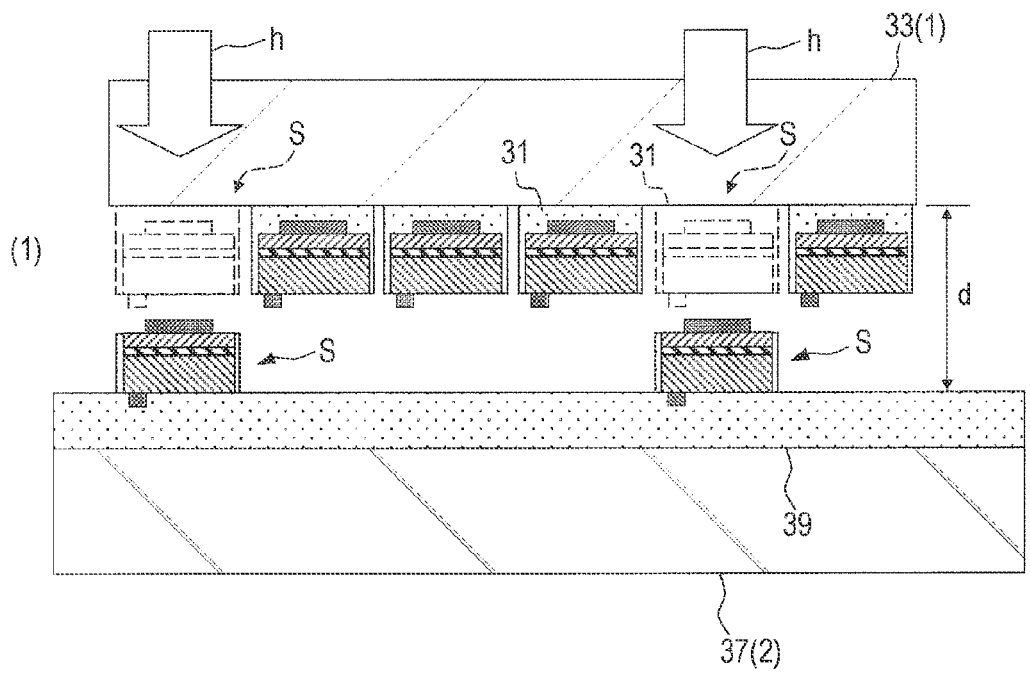
FIG. 8C is a sectional step view (No. 3) showing the manufacturing step of the display device of the eighth embodiment.
Figure 8C:
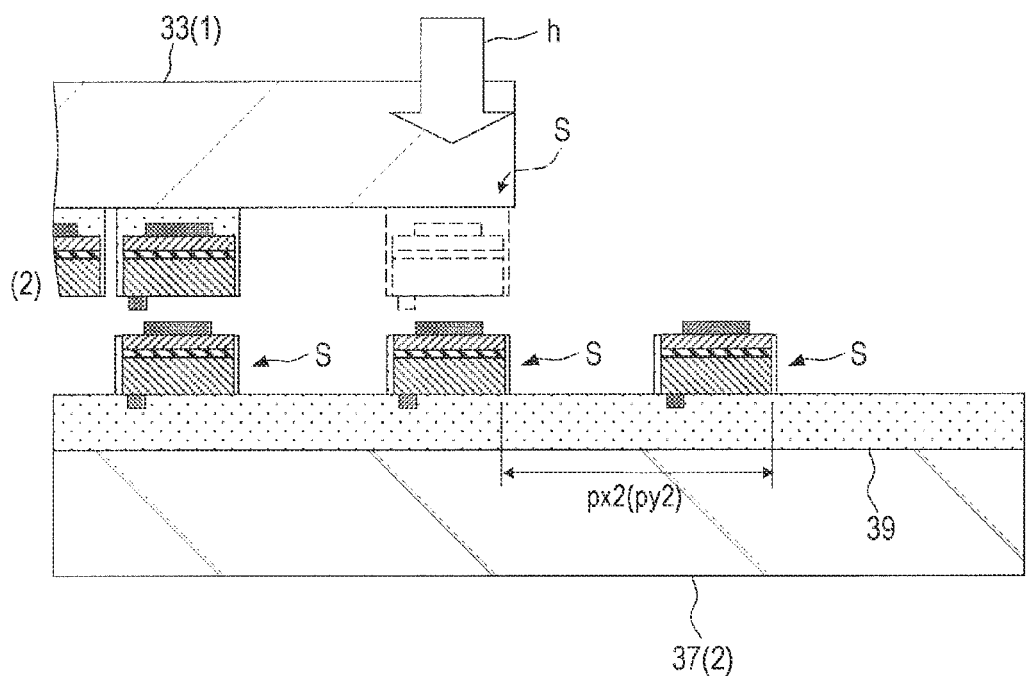

Next, as shown in (1) in FIG. 8C, the support substrate 33 is made the first substrate 1 in the first to the seventh embodiments, and the light-emitting elements S are mounted from the support substrate 33 (first substrate 1) to a temporal holding substrate 37 at an enlarged pitch. The temporal holding substrate 37 is the second substrate 2 in the first to the seventh embodiments. With respect to the temporal holding substrate 37, it is assumed that the horizontal and vertical sizes as viewed in plane are, for example, integer times larger than the first substrate 1 and its shape is substantially the same shape as the display device fabricated here, or the horizontal and vertical sizes are approximately integer times smaller than the horizontal and vertical sizes of the display device. Hereinafter, the substrates are simply referred to as the first substrate 1 and the second substrate 2.

At this time, first, a slightly adhesive adhesion layer 39 made of elastic material having a slightly adhesive property, such as silicone rubber, is formed on one principal surface of the second substrate 2, and the formation surface side of the light-emitting elements S on the first substrate 1 is arranged to be opposite to the formation surface side of the adhesion layer 39. At this time, it is important that an interval d between the first substrate 1 and the adhesion layer 39 on the second substrate 2 is set to be twice or more the light-emitting element S.

In this state, the laser light h is selectively irradiated to the adhesion layers 31 of portions of the light-emitting elements S to be transferred to the second substrate 2 side from the first substrate 1 side. At this time, the irradiation of the laser light h is made to be performed after a not-shown light shielding mask is arranged on the first substrate 1 side, and the laser light h is simultaneously irradiated to the portions of the plural light-emitting elements S. By this, the adhesion layers 31 of the irradiated portions of the laser light hare abraded, and the corresponding plural light-emitting elements S are collectively transferred to the second substrate 2 side. In this abrasion, the temperature of the adhesion layer 31 (sacrifice layer) absorbing the laser light h is abruptly raised by the energy, and the layer is evaporated, so that the element is separated, jumps out almost in the vertical direction by the gas pressure, and lands on the adhesive portion on the element receiving substrate.

The above collective transfer is performed as the collective transfer of the first step in the first to the seventh embodiments, and the selected light-emitting elements S are mounted onto the respective areas set on the second substrate 2.

Next, as shown in (2) in FIG. 8C, the first substrate is shifted or rotated in a plane with respect to the second substrate 2. At this time, when the interval d between the first substrate 1 and the adhesion layer 39 on the second substrate 2 is kept larger than twice the light-emitting element S, the arrangement state of the first substrate 1 relative to the second substrate 2 can be set irrespective of the light-emitting elements S mounted on the first substrate in the first step.

In this state, the laser light h is selectively irradiated to the adhesion layers 31 of the portions of the light-emitting elements S to be transferred from the first substrate 1 side to the second substrate 2 side. At this time, similarly to the first step, the irradiation of the laser light h is made to be performed after a not-shown light shielding mask is arranged on the first substrate 1 side, and the laser light h is simultaneously irradiated to the portions of the plural light-emitting elements S. By this, the adhesion layers 31 of the irradiated portions of the laser light h are abraded, and the corresponding plural light-emitting elements S are collectively transferred to the second substrate 2.

The above collective transfer is performed as the collective transfer of the second step in the first to the seventh embodiments, and in the respective areas set on the second substrate 2, the collective transfer is performed so that the light-emitting elements S are transferred to between the light-emitting elements S already mounted on the second substrate 2.

By the collective transfer in the first step and the second step, the light-emitting elements S arranged on the first substrate 1 at the specified initial pitches px1 and py1 are rearranged on the second substrate 2 at the enlarged pitches px2 and py2 enlarged to the pixel pitch. When the light-emitting elements S are rearranged by applying the fifth to the seventh embodiments, two adjacent light-emitting elements S formed of the light-emitting element S mounted in the first step of (1) in FIG. 8C and the light-emitting element S mounted in the second step of (2) in FIG. 8C are arranged to be close to each other in the same pixel area. The first mounting of the light-emitting elements S from the first substrate 1 to the second substrate 2 shown in (1) in FIG. 8C may be performed in the state where the light-emitting elements S on the first substrate 1 contact with the second substrate 2 side.

Figure 8D:
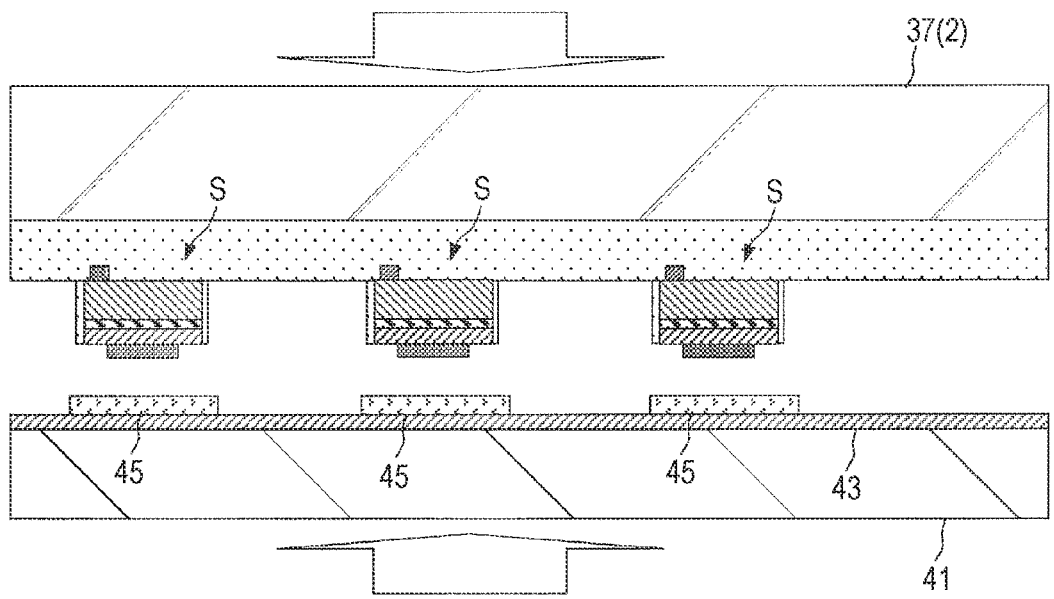
FIG. 8D is a sectional step view (No. 4) showing the manufacturing step of the display device of the eighth embodiment.
Figure 8D:
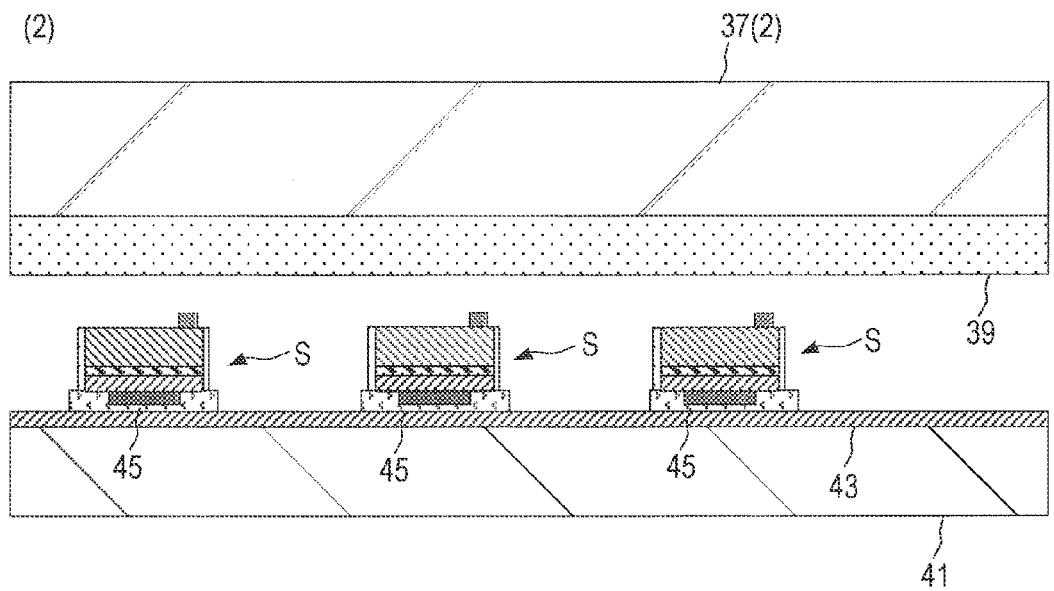

Next, as shown in (1) in FIG. 8D, a device substrate 41 on which a drive wiring and the like of the display device are formed is prepared. The device substrate 41 is provided with, for example, plural scanning lines 43, and conductive adhesion layers 45 are pattern-formed in pixel areas on the respective scanning lines 43. The light-emitting element S holding surface side of the second substrate 2 is arranged to be opposite to the formation surface side of the conductive adhesion layers 45 of the device substrate 41, and the device substrate 41 and the second substrate 2 are positioned so that the respective conductive adhesion layers 45 and the light-emitting elements S are in one-to-one correspondence with each other.

In this state, the second substrate 2 is pressed to the device substrate 41, and the light-emitting elements S are bonded and fixed to the conductive adhesion layers 45. At this time, an uncured adhesive not shown here is provided on the device substrate 41 side, and the substrates 2 and 41 are brought into press contact.

Next, as shown in (2) in FIG. 8D, the light-emitting elements S are made to remain on the device substrate 41 in the state where they are fixed to the conductive adhesion layers 45, and the second substrate 2 (the temporal holding substrate 37) and the upper adhesion layer 39 are peeled off from the device substrate 41 side. By this, since the adhesive on the device substrate 41 has the adhesive force sufficiently larger than the adhesive force of the slightly adhesive layer on the second substrate 2, the light-emitting elements S are separated from the second substrate 2 and are mounted onto the device substrate 41 side.

Figure 8E:
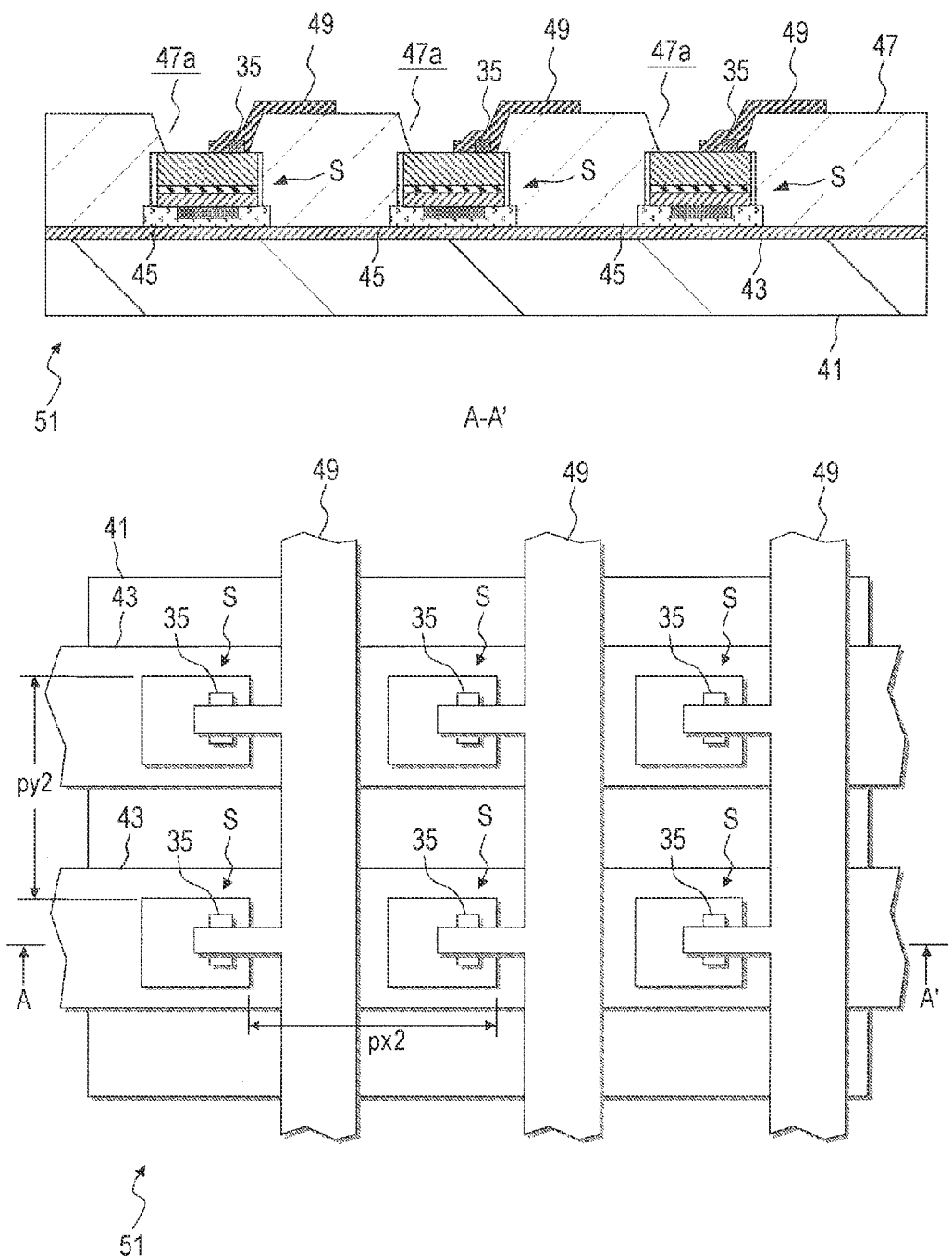
FIG. 8E is a sectional view and a plan view of the display device obtained by the eighth embodiment.

A subsequent step is shown in a sectional view and a plan view of FIG. 8E. The sectional view corresponds to an A-A' section in the plan view. As shown in these drawings, an interlayer insulating film 47 (shown only in the sectional view) covers the device substrate 41 on which the light-emitting elements S are arranged at the specified pixel pitches (enlarged pitches) px2 and py2. Next, connection holes 47a (shown only in the sectional view) to expose the n-type electrodes 35 of the respective light-emitting elements S are formed in the interlayer insulating film 47.

Thereafter, wirings connected to the n-type electrodes 35 through the connection holes 47a are formed as, for example, signal lines 49 on the interlayer insulating film 47. The signal lines 49 are extended in the vertical direction to the scanning lines 43, and are arranged in the state where the plural light-emitting elements S are connected to one signal line 49. Besides, the light-emitting elements S are arranged for the respective pixels set at the respective intersection parts between the scanning lines 43 and the signal lines 49.

Incidentally, when the fifth to the seventh embodiments are applied and the light-emitting elements S are rearranged, plural (two) light-emitting elements S are arranged for each of the pixels set at the respective intersection parts between the scanning lines 43 and the signal lines 49. The two light-emitting elements S are connected in series or in parallel between the same scanning line 43 and the signal line 49.

In the manner as described above, a display device 51 in which the plural light-emitting elements S are rearranged at the specified pixel pitches px2 and py2 is completed.

The display device 51 obtained in this way is such that the light-emitting elements S are rearranged in the steps shown in (1) in FIG. 8D and (2) in FIG. 8D by the collective transfer as described in the first to the seventh embodiments. Thus, the distribution of the emission characteristics in the element arrangement on the growth substrate 21 and the first substrate 1 is diffused, and it becomes possible to realize a display of excellent display quality in which visual recognition of color unevenness is prevented.

Incidentally, in the eighth embodiment, in the step described with reference to FIG. 8C, the description is made on the procedure in which the pitches are enlarged and the light-emitting elements S are mounted from the support substrate 33 (first substrate 1) onto the temporal holding substrate 37 (second substrate 2). However, the present invention can be applied to various mounting procedures in which the light-emitting elements S can be rearranged between different substrates while the arrangement state thereof is changed as described in the first to the seventh embodiments, and the same effects as those described in the first to the seventh embodiments can be obtained. For example, the second substrate is not limited to the temporal holding substrate 37, and a device substrate (wiring substrate) on which a wiring and the like are provided may be used as the second substrate instead of the temporal holding substrate 37. Besides, plural temporal holding substrates 37 may be used for one support substrate 33 (first substrate 1). Further, a procedure may be such that after the first mounting of the light-emitting elements S onto the temporal holding substrate 37 is performed, the light-emitting elements S are continuously mounted from the temporal holding substrate 37 to the device substrate (wiring substrate), and this is repeatedly performed.

Ninth Embodiment

Figure 9A:
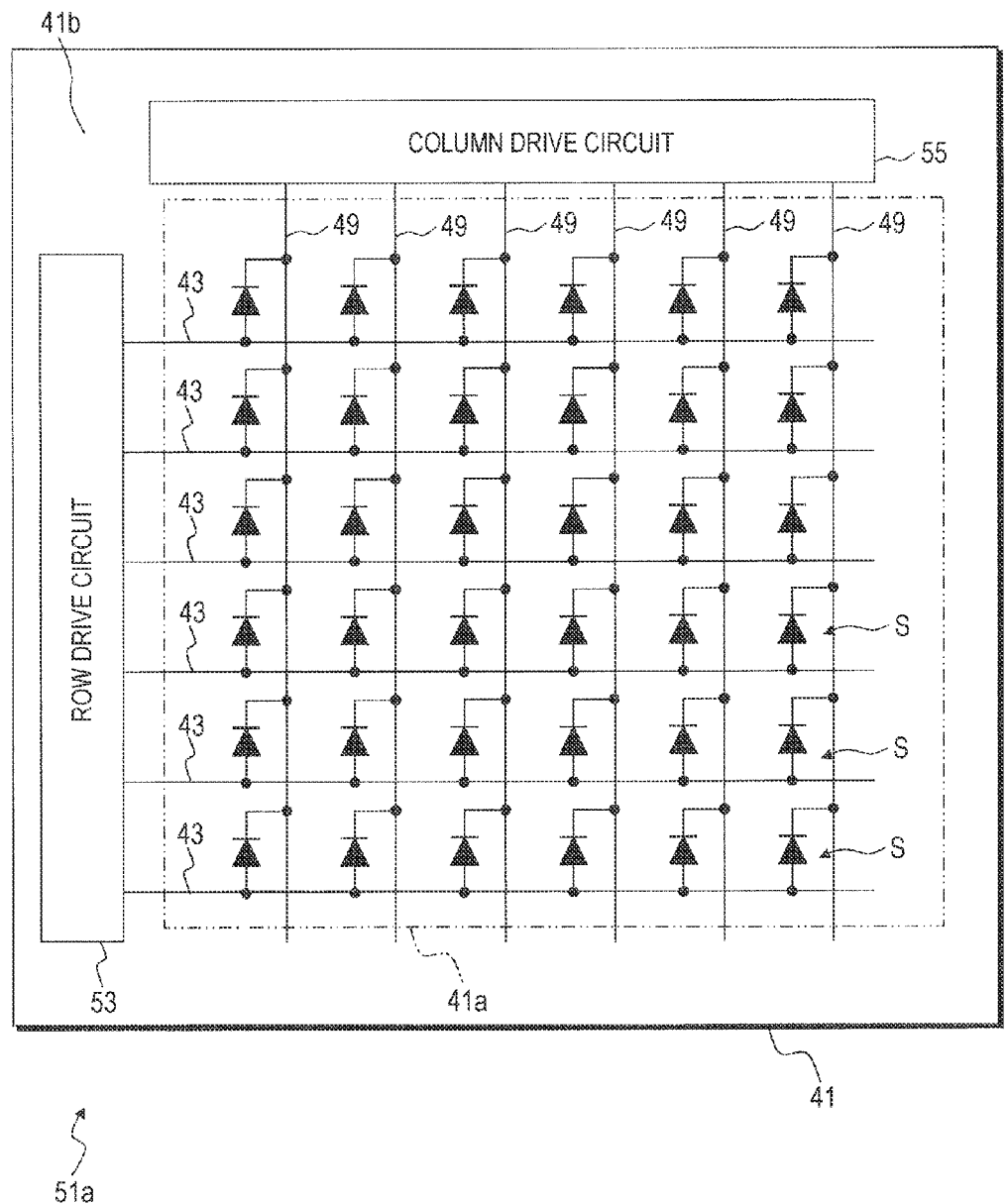
FIG. 9A is a view showing a circuit structure of a display device to which an embodiment of the invention is applied.
Figure 9B:
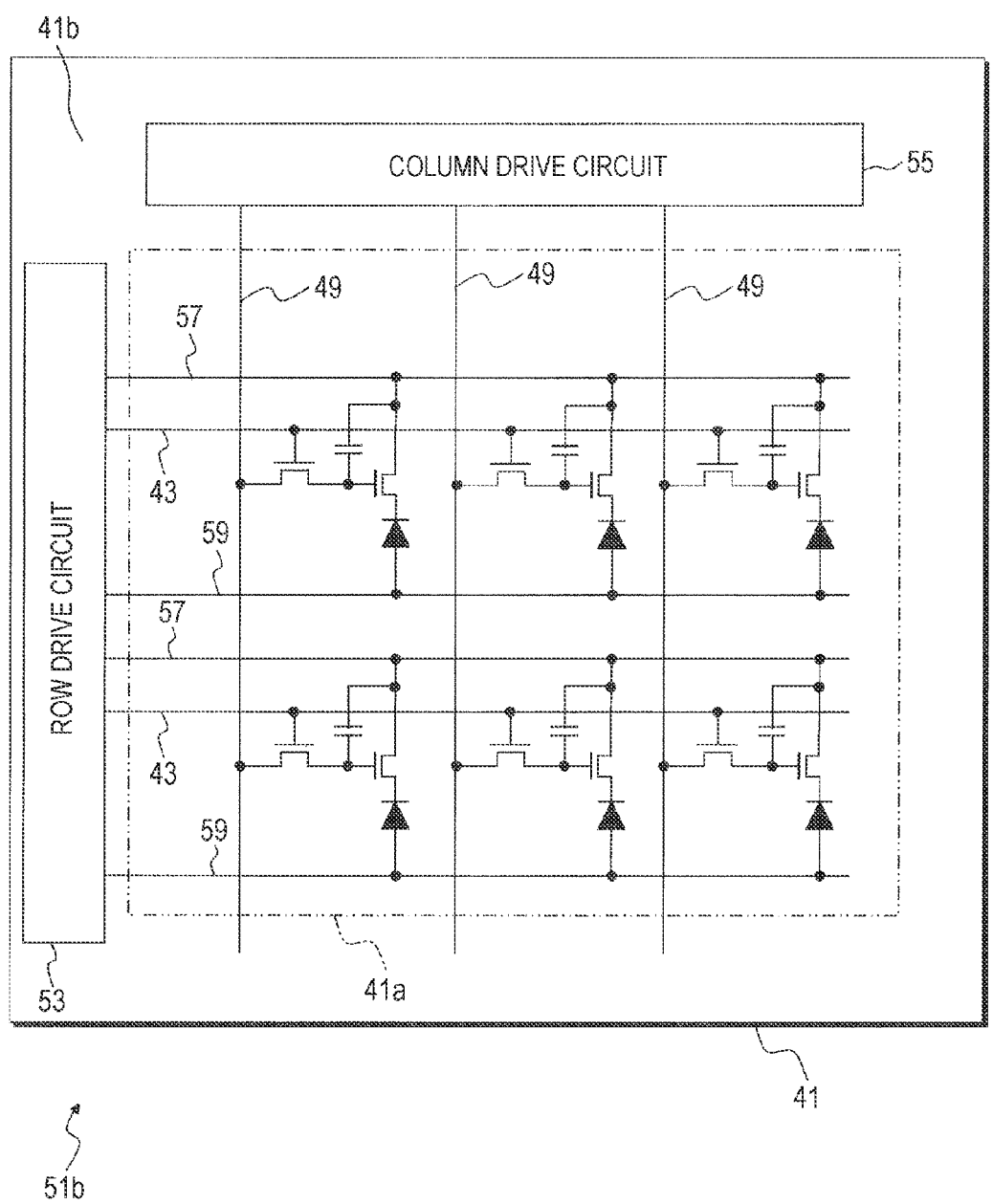
FIG. 9B is a view showing another example of a circuit structure of a display device to which an embodiment of the invention is applied.

FIG. 9A and FIG. 9B are views showing a circuit structure of a display device to which the embodiment of the invention is applied. Hereinafter, the circuit structure of the display device will be described with reference to these drawings.

First, a display device 51a shown in FIG. 9A is a passive matrix type display device, and has a following circuit structure. That is, a display area 41a and its peripheral area 41b are set on a device substrate 41. Plural scanning lines 43 and plural signal liens 49 are provided vertically and horizontally in the display area 41a, and are constructed as a pixel array part in which one pixel 11 is provided correspondingly to each of intersection parts thereof, and light-emitting elements S are arranged for the respective pixels 11.

When plural light-emitting elements S are rearranged for one pixel 11 by applying the fifth to the seventh embodiments, the plural light-emitting elements S are connected and arranged in series or in parallel between the scanning line 43 and the signal line 49.

A row drive circuit 53 to scan the drive scanning lines 43 and a column drive circuit 55 to supply video signals (that is, input signals) corresponding to brightness information to the signal lines 49 are disposed in the peripheral region 41b.

By this, a current corresponding to the signal amount is supplied to the light-emitting element S of the pixel 11 selected by the scanning line 43 and the signal line 49, and the light-emitting elements S emits light at the brightness corresponding to this current value.

A display device 51b shown in FIG. 9B is an active matrix type display device, and has a following circuit structure. That is, a display area 41a and a peripheral area 41b are set on a device substrate 41. Plural scanning lines 43 and plural signal lines 49 are provided in the display region 41a vertically and horizontally, and are constructed as a pixel array part in which one pixel 11 is provided correspondingly to each of intersection parts thereof. Besides, a row drive circuit 53 to scan and drive the scanning lines 43 and a column drive circuit 55 to supply video signals (that is, input signals) corresponding to brightness information to the signal lines 49 are disposed in the peripheral region 41b.

A pixel circuit is provided for each pixel 11 provided at each of the intersection parts between the scanning lines 43 and the signal lines 49. The pixel circuit includes, for example, a thin film transistor Tr1 for switching, a thin film transistor Tr2 for driving, a holding capacitance Cs, and a light-emitting element S. The thin film transistor Tr1 for switching is connected to the scanning line 43 and the signal line 49, and the thin film transistor Tr2 for driving and the holding capacitance Cs are connected to the thin film transistor Tr1. The thin film transistor Tr2 for driving and the holding capacitance Cs are connected to a common power supply line (Vcc) 57, and the light-emitting element S is connected to the thin film transistor Tr2 for driving and the power source line 59. A video signal written from the signal line 49 through the thin film transistor Tr1 for switching is held in the holding capacitance Cs, a current corresponding to the held signal amount is supplied from the thin film transistor Tr2 for driving to the light-emitting element S, and the light-emitting element S emits light at the brightness corresponding to the current value.

The structure of the pixel circuit as described above is merely an example, and a capacitive element may be provided in the pixel circuit as the need arises, or plural transistors may be further provided to form the pixel circuit. Besides, a necessary drive circuit is added to the peripheral area 1b according to the change of the pixel circuit.

The present application contains subject matter related to that disclosed in Japanese Priority Patent Application JP 2009-095897 filed in the Japan Patent Office on Apr. 10, 2009, the entire contents of which is hereby incorporated by reference.

It should be understood by those skilled in the art that various modifications, combinations, sub-combinations and alterations may occur depending on design requirements and other factors insofar as they are within the scope of the appended claims or the equivalents thereof. a1

What is claimed is:

1. A display device comprising:
    a first element group including a first plurality of light-emitting elements arranged to have a specified distribution of emission characteristics; and
    a second element group including a second plurality of light-emitting elements,
    wherein,
        the second plurality of light-emitting elements are arranged in a same direction of emission characteristics as the first plurality of light-emitting elements of the first element group,
        each of the second plurality of light-emitting elements are arranged directly adjacent to at least three of the first plurality of light-emitting elements constituting the first element group, and
        the first plurality of light-emitting elements of the first element group and rotated at an angle of 180° in a plane with respect to the plurality of light-emitting elements of the first element group,
        the second plurality of light-emitting elements are at least shifted with respect to the first plurality of light-emitting elements of the first element group, and (ii) rotated in a plane with respect to the first plurality of light-emitting elements of the first element group.

2. The display device according to claim 1, wherein the first element group and the second element group are respectively provided in a plurality of arrangement areas adjacent to each other.

3. The display device according to claim 1 or 2, wherein in the first element group and the second element group, the light-emitting elements are arranged in a distribution where emission characteristics are changed from a center in a plane of the arrangement area to both sides, and the arrangement area of the second element group is provided to be shifted, with respect to the arrangement area of the first element group, by half a size in a direction where the emission characteristics are changed.

4. The display device according to claim 1 or 2, wherein in the first element group and the second element group, the light-emitting elements are arranged in a distribution where emission characteristics are radially changed from a center in a plane of the arrangement area to an outside, and the arrangement area of the second element group is provided to be shifted, with respect to the arrangement area of the first element group, by half a size in a longitudinal direction and a lateral direction.

5. The display device according to claim 1 or 2, wherein in the first element group and the second element group, the light-emitting elements are arranged in a distribution where emission characteristics are radially changed from one end corner in a plane of the arrangement area, and the second element group is provided in an arrangement state where an arrangement state in the first element group is rotated by 180° in a plane.

6. The display device according to claim 1 or 2, wherein in the first element group and the second element group, the light-emitting elements are arranged in a distribution where emission characteristics are radially changed to an outside from a center deviated to a direction of one end corner in a plane, and the second element group includes
    a first group provided in an arrangement state where an arrangement state in the first element group is rotated by 180° in a plane,
    a second group provided in an arrangement area shifted, with respect to the arrangement area of the first element group, by half a size in a longitudinal direction and a lateral direction, and
    a third group provided in an arrangement state in which in the arrangement area shifted, with respect to the arrangement area of the first element group, by half the size in the longitudinal direction and the lateral direction, the arrangement state in the first element group is rotated by 180° in the plane.

7. The display device according to claim 1 or 2, wherein one pixel includes a light-emitting element of the first element group and a light-emitting element of the second element group, which are arranged adjacently to each other.

8. The display device according to claim 1, wherein each of the second plurality of light-emitting elements are orthogonally arranged to the at least three of the first plurality of light-emitting elements constituting the first element group.

* * * * *